United States Patent
Kim et al.

(10) Patent No.: US 7,933,356 B2
(45) Date of Patent: Apr. 26, 2011

(54) DTV TRANSMITTING SYSTEM AND RECEIVING SYSTEM AND METHOD OF PROCESSING BROADCAST SIGNAL

(75) Inventors: Jin Woo Kim, Seoul (KR); In Hwan Choi, Gyeonggi-do (KR); Hyoung Gon Lee, Seoul (KR)

(73) Assignee: LG Electronics, Inc., Seoul (KR)

( * ) Notice: Subject to any disclaimer, the term of this patent is extended or adjusted under 35 U.S.C. 154(b) by 0 days.

(21) Appl. No.: 12/854,154

(22) Filed: Aug. 10, 2010

(65) Prior Publication Data

US 2010/0302458 A1  Dec. 2, 2010

Related U.S. Application Data

(63) Continuation of application No. 11/740,157, filed on Apr. 25, 2007, now Pat. No. 7,801,243.

(60) Provisional application No. 60/821,248, filed on Aug. 2, 2006.

(30) Foreign Application Priority Data

Apr. 25, 2006 (KR) .................... 10-2006-0037181
Sep. 15, 2006 (KR) .................... 10-2006-0089736

(51) Int. Cl.
  *H04L 27/00* (2006.01)
  *H04L 1/02* (2006.01)
  *H04B 7/02* (2006.01)
(52) U.S. Cl. .................. 375/295; 375/267; 375/299
(58) Field of Classification Search .......... 375/267, 375/295, 299
See application file for complete search history.

(56) References Cited

U.S. PATENT DOCUMENTS

| | | | | |
|---|---|---|---|---|
| 5,428,631 | A * | 6/1995 | Zehavi | 714/792 |
| 5,488,635 | A * | 1/1996 | Chennakeshu et al. | 375/340 |
| 5,850,403 | A * | 12/1998 | Lasne | 714/755 |
| 6,470,047 | B1 * | 10/2002 | Kleinerman et al. | 375/232 |
| 6,977,977 | B1 * | 12/2005 | Dubrovin et al. | 375/346 |
| 7,190,734 | B2 * | 3/2007 | Giannakis et al. | 375/267 |

(Continued)

FOREIGN PATENT DOCUMENTS

WO   2005006759   1/2005

(Continued)

OTHER PUBLICATIONS

Sung-Hoon Kim et al; "Enhanced-x VSB system development for improving ATSC terrestrial DTV transmission standard," IEEE Transactions on Broadcasting, vol. 52, No. 2, pp. 129-136, Jun. 2006.

*Primary Examiner* — David C Payne
*Assistant Examiner* — Erin M File
(74) *Attorney, Agent, or Firm* — Lee, Hong, Degerman, Kang & Waimey

(57) ABSTRACT

A DTV transmitting system includes a pre-processor, a block processor, and a trellis encoder. The pre-processor pre-processes enhanced data by expanding the enhanced data at an expansion rate of 1/H. The block processor includes a first converter, a symbol encoder, a symbol interleaver, and a second converter. The first converter converts the expanded data into symbols. The symbol encoder encodes each valid enhanced data bit in the symbols at an effective coding rate of 1/H. The symbol interleaver interleaves the encoded symbols, and the second converter converts the interleaved symbols into enhanced data bytes. The trellis encoder trellis-encodes the enhanced data outputted from the block processor.

10 Claims, 17 Drawing Sheets

U.S. PATENT DOCUMENTS

| | | | |
|---|---|---|---|
| 7,609,782 B2 * | 10/2009 | Giannakis et al. | 375/299 |
| 7,620,118 B2 * | 11/2009 | Choi | 375/301 |
| 2002/0154709 A1 | 10/2002 | Choi et al. | |
| 2003/0103575 A1 * | 6/2003 | Birru et al. | 375/265 |
| 2004/0071241 A1 * | 4/2004 | Bouillet et al. | 375/347 |
| 2005/0097428 A1 | 5/2005 | Chang et al. | |
| 2006/0053436 A1 * | 3/2006 | Allwein et al. | 725/1 |
| 2006/0085726 A1 * | 4/2006 | Rhee et al. | 714/784 |
| 2006/0285608 A1 | 12/2006 | Kim et al. | |
| 2007/0053606 A1 * | 3/2007 | Ali | 382/274 |
| 2007/0071110 A1 * | 3/2007 | Choi et al. | 375/240.27 |
| 2007/0248055 A1 * | 10/2007 | Jain et al. | 370/331 |
| 2008/0063089 A1 * | 3/2008 | Chen | 375/240.26 |
| 2008/0279270 A1 * | 11/2008 | Zeng | 375/231 |

FOREIGN PATENT DOCUMENTS

| | | |
|---|---|---|
| WO | 2005115001 | 12/2005 |

* cited by examiner

DTV TRANSMITTING SYSTEM AND RECEIVING SYSTEM AND METHOD OF PROCESSING BROADCAST SIGNAL

This application is a continuation of U.S. Application Ser. No. 11/740,157, filed on Apr. 25, 2007 now U.S. Pat. No. 7,801,243, which claims the benefit of Korean Patent Application No. 10-2006-0037181, filed on Apr. 25, 2006, Korean Patent Application No. 10-2006-0089736, filed on Sep. 15, 2006, and U.S. Provisional Application No. 60/821,248, filed on Aug. 2, 2006, the contents of which are all hereby incorporated by reference herein in their entireties.

BACKGROUND OF THE INVENTION

1. Field of the Invention

The present invention relates to a digital television (DTV) transmitting system and receiving system and a method of processing a broadcast signal.

2. Discussion of the Related Art

Presently, the technology for processing digital signals is being developed at a vast rate, and, as a larger number of the population uses the Internet, digital electric appliances, computers, and the Internet are being integrated. Therefore, in order to meet with the various requirements of the users, a system that can transmit diverse supplemental information in addition to video/audio data through a digital television channel needs to be developed.

Some users may assume that supplemental data broadcasting would be applied by using a PC card or a portable device having a simple in-door antenna attached thereto. However, when used indoors, the intensity of the signals may decrease due to a blockage caused by the walls or disturbance caused by approaching or proximate mobile objects. Accordingly, the quality of the received digital signals may be deteriorated due to a ghost effect and noise caused by reflected waves. However, unlike the general video/audio data, when transmitting the supplemental data, the data that is to be transmitted should have a low error ratio. More specifically, in case of the video/audio data, errors that are not perceived or acknowledged through the eyes or ears of the user can be ignored, since they do not cause any or much trouble. Conversely, in case of the supplemental data (e.g., program execution file, stock information, etc.), an error even in a single bit may cause a serious problem. Therefore, a system highly resistant to ghost effects and noise is required to be developed.

The supplemental data are generally transmitted by a time-division method through the same channel as the video/audio data. However, with the advent of digital broadcasting, digital television receiving systems that receive only video/audio data are already supplied to the market. Therefore, the supplemental data that are transmitted through the same channel as the video/audio data should not influence the conventional receiving systems that are provided in the market. In other words, this may be defined as the compatibility of broadcast system, and the supplemental data broadcast system should be compatible with the broadcast system. Herein, the supplemental data may also be referred to as enhanced data. Furthermore, in a poor channel environment, the receiving performance of the conventional receiving system may be deteriorated. More specifically, resistance to changes in channels and noise is more highly required when using portable and/or mobile receiving systems.

SUMMARY OF THE INVENTION

Accordingly, the present invention is directed to a DTV transmitting system and receiving system and a method of processing a broadcast signal that substantially obviate one or more problems due to limitations and disadvantages of the related art.

The present invention is to provide a DTV transmitting system and receiving system and a method of processing a broadcast signal, which are suitable for transmission of enhanced data and resistant against noise.

The present invention is to provide a DTV transmitting system and receiving system and a method of processing a broadcast signal, which are capable of performing additional encoding and stratifying for enhanced data, according to degree of importance of the enhanced data, and transmitting it, thereby enhancing receiving performance of a receiving system.

Yet another object of the present invention is to provide a DTV transmitting system and receiving system and a method of processing a broadcast signal, which are capable of stratifying known data, which are identified at transmitting/receiving ends, and enhanced data, and multiplexing them with main data, thereby enhancing receiving performance.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a digital television (DTV) transmitting system includes a pre-processor, a block processor, and a trellis encoder. The pre-processor pro-processes enhanced data by coding the enhanced data for forward error correction (FEC) and expanding the FEC-coded enhanced data at an expansion rate of 1/H. The block processor codes a block of the pre-processed enhanced data, and the trellis encoder trellis-encodes the coded block of the pre-processed enhanced data.

The block processor includes a first converter, a symbol encoder, a symbol interleaver, and a second converter. The first converts the expanded enhanced data into corresponding symbols. The symbol encoder encodes the converted symbols. The symbol encoder encodes each valid enhanced data bit in the converted symbols at an effective coding rate of 1/H. In a first example, the symbol encoder may encode each valid enhanced data bit in the symbols at a coding rate of 1/2 twice in order to result an effective coding rate of 1/4. In a second example, it may encode each valid enhanced data bit at a coding rate of 1/2 and repeat the encoded data bits once in order to result the same effective coding rate. Alternatively, it may simply encode each valid enhanced data bit at a coding rate of 1/4 to result the same effective coding rate.

In another aspect of the present invention, a DTV receiving system includes a tuner, a demodulator, a channel equalizer, and a block decoder. The tuner tunes to a channel to receive a digital broadcast signal including enhanced data. The demodulator demodulates the received broadcast signal, and the channel equalizer compensates channel distortion of the demodulated signal. The block decoder decodes a block of enhanced data symbols included in the channel-equalized signal. It includes a trellis decoder, a symbol deinterleaver, and a symbol decoder. The trellis decoder performs trellis-decoding on the block of enhanced data symbols. The symbol deinterleaver deinterleaves the trellis-decoded enhanced data symbols. The symbol decoder further decodes the deinterleaved symbols.

In order to perform turbo decoding on the block of enhanced data symbols, the block decoder may further include a symbol interleaver interleaving the symbols decoded by the symbol decoder, and a multiplexer multiplexing the interleaved symbols with the block of enhanced data symbols.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

The terminologies disclosed the present application is widely used in this field of the present invention. However, some of them are defined by the inventors. In this case, the newly defined terminologies are described in detail in the following description. Therefore, the terminologies in the present invention will be understood on the basis of the disclosure of the present application.

Enhanced data in the present application may be any of application program execution files, data having information, such as stock information, etc., and video/audio data. Known data may be data which is previously known in transmitting/receiving ends, based on a protocol. Main data is indicative of data which can be received by the conventional receiving systems, including video/audio data.

The present invention serves to identify enhanced data having information according to predetermined conditions, and to individually or integratedly perform additional encoding for the identified enhanced data, respectively. Here, the conditions for identifying the types of the enhanced data may be determined by many factors. For example, the enhanced data may be identified by degree of importance thereof. Here, the enhanced data can be transmitted on the basis of a format of enhanced data having information as well as a format of enhanced data having video/audio data.

In order to group a plurality of enhanced data packets, multiplex the group with main data, and transmit them, the present invention stratifies the group to form a plurality of regions, and classifies types of inserted data, and processing methods, etc., according to characteristics of stratified regions.

In addition, the present invention can classify enhanced data into N types of enhanced data, from high priority to low priority. On the other hand, although the present invention will be described on the basis of the high priority enhanced data and the low priority enhanced data for a convenient description, it will be easily appreciated that such an implementation is just an embodiment, and there may be many embodiments modified therefrom. Therefore, the present invention must not be limited by such embodiments.

Figure 1:
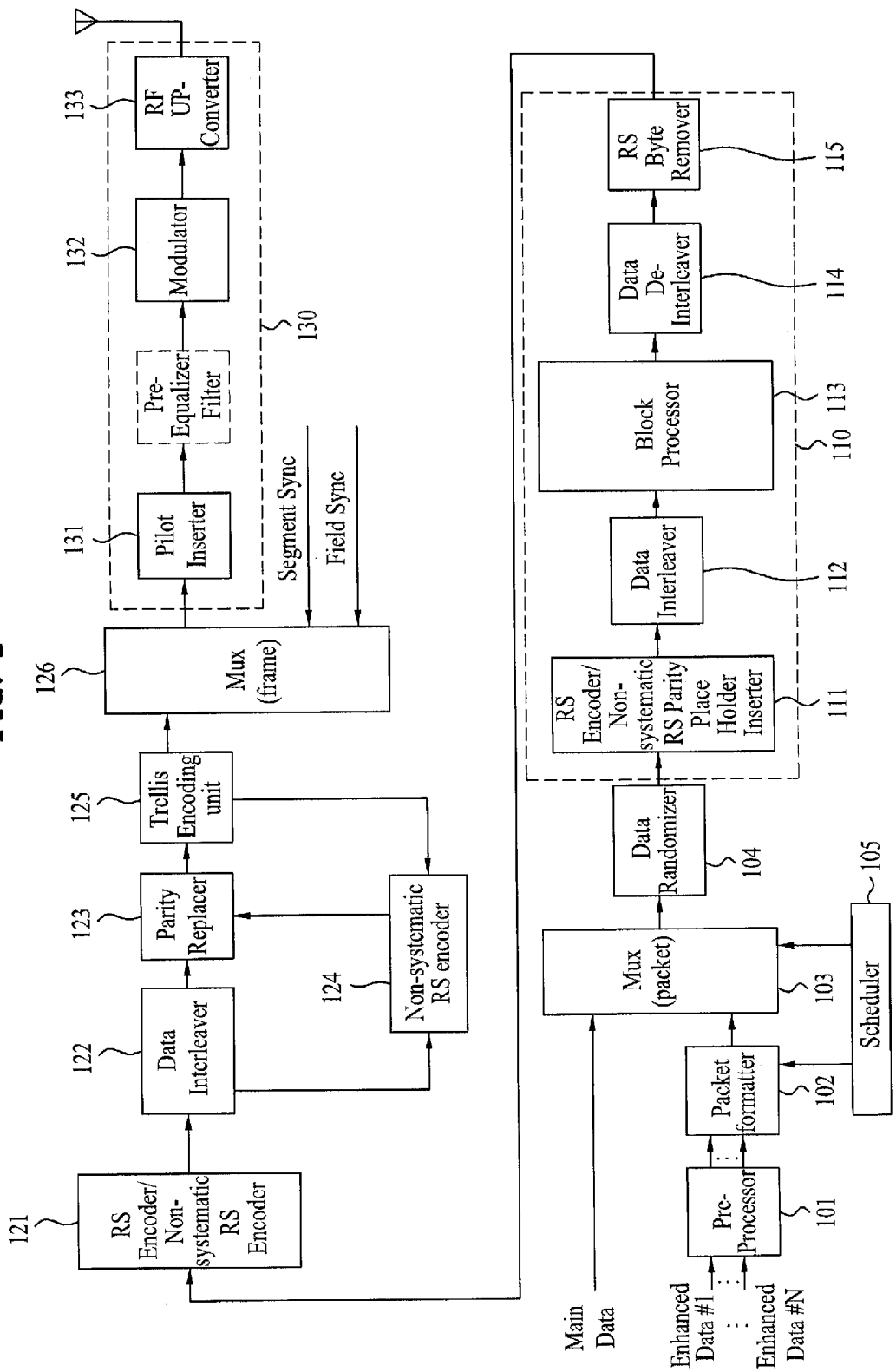
FIG. 1 illustrates a schematic block diagram of a digital broadcast transmitting system according to an embodiment of the present invention.

FIG. 1 illustrates a schematic block diagram of a digital broadcast transmitting system according to an embodiment of the present invention. Namely, the digital broadcast transmitting system inputs the identified enhanced data, performs additional encoding for the inputted enhanced data, individually or integratedly, and then multiplexes the encoded result with main data to transmit it.

The digital broadcast transmitting system includes a pre-processor 101, a packet formatter 102, a packet multiplexer 103, a data randomizer 104, a scheduler 105, a post-processor 110, an RS encoder/non-systematic RS encoder 121, a data interleaver 122, a parity replacer 123, a non-systematic RS encoder 124, a Trellis encoding unit 125, a frame multiplexer 126, and a transmitting unit 130.

The pre-processor 101 inputs enhanced data and then performs pre-processing, such as additional block encoding, block interleaving, byte expansion through insertion of null data, etc. Afterwards, the pre-processing result is outputted to the packet formatter 102.

Here, when the inputted enhanced data is the high priory enhanced data and the low priority enhanced data, the pre-processor 101 performs pre-processing, such as additional block encoding, block interleaving, byte expansion, etc., respectively. After that, the data, which is classified by degree of importance, is outputted to the packet formatter 102 while its classified state is kept. The operations of the pre-processor 101 will be described in detail later.

The packet formatter 102 collects the pre-processed enhanced data on the basis of packet unit, to group them, according to control of the scheduler 105. Here, the packet is indicative of an enhanced data packet of 188 byte unit as MPEG header of 4 bytes is added thereto. The enhanced data packet can be composed of only enhanced data or only known data (or known data places). Also, the enhanced data packet can be composed of a result that the enhanced data and the known data are multiplexed. Also, the enhanced data packet may include an initialization data place holder for a Trellis memory, which will be described later.

Later, there may be a detailed description for a rule related to formation of data groups in the packet formatter 102.

The packet formatter 102 outputs its output to the packet multiplexer 103. The packet multiplexer 103 performs time divisional multiplexing for the main data packet and the data group, on the basis of Transport Stream (TS) packet unit, to output them to the data randomizer 104, according to control of the scheduler 105.

Here, the scheduler 105 generates and outputs a control signal such that the packet formatter 102 can multiplex the enhanced data, the known data (or known data place holder), and an initialization data place holder. Also, the scheduler 105 generates and outputs a control signal such that the packet multiplexer 103 can multiplex the main data packet and the data group on the basis of packet unit.

The data randomizer 104 deletes MPEG synchronization bytes from the data and randomizes the remaining 187 bytes using a pseudo random byte generated therein. After that, the randomization result is outputted to the post-processor 110.

The post-processor 110 includes an RS encoder/non-systematic RS parity place holder inserter 111, a data interleaver 112, a block processor 113, a data deinterleaver 114, and an RS byte remover 115.

The RS encoder/non-systematic RS parity place holder inserter 111 performs systematic RS encoding when the randomized data is a main data packet, and non-systematic RS parity holder insertion when the randomized data is an enhanced data packet. Namely, like the conventional broadcast system, the RS encoder/non-systematic RS parity place holder inserter 111 performs systematic RS encoding when the packet of 187 bytes, which is outputted from the data randomizer 104, is a main data packet, and then adds a parity of 20 bytes to the end of the 187 byte data, to output it to the data interleaver 112.

On the other hand, the RS encoder/non-systematic RS parity place holder inserter 111 inserts an RS parity place holder, which is composed of null data of 20 bytes, into a packet to perform non-systematic RS encoding, when the packet of 187 bytes, which is outputted from the data randomizer 104, is an enhanced data packet. Also, the RS encoder/non-systematic RS parity place holder inserter 111 inserts the bytes of the enhanced data packet in the places of the remaining 187 bytes to output them to the data interleaver 112.

The data interleaver 112 performs data interleaving for the output of the RS encoder/non-systematic RS parity place holder inserter 111 and then outputs the data interleaving result to the block processor 113.

The block processor 113 performs additional encoding for only the enhanced data, which is outputted from the data interleaver 112, and then outputs it to the data interleaver 114. The data deinterleaver 114 performs data deinterleaving for the inputted data and then outputs it to the RS byte remover 115. Here, the data deinterleaver 114 performs a reverse operation of the data interleaver 112. The additional encoding process of the block processor 113 will be described in detail later.

The RS byte remover 115 deletes the parity of 20 bytes, which is added in the RS encoder/non-systematic RS parity place holder inserter 111. Here, when the inputted data is a main data packet, last 20 bytes of the 207 bytes are deleted, and when the inputted data is an enhanced data packet, the parity place holders of 20 bytes of 207 bytes are deleted, in which the parity place holders of 20 bytes are inputted to perform non-systematic RS encoding. Such processes are performed to re-calculate a parity since the original data is changed by the block processor 113 in the case that the inputted data is enhanced data.

The RS byte remover 115 outputs its output to the RS encoder/non-systematic RS encoder 121.

The RS encoder/non-systematic RS encoder 121 adds a parity of 20 bytes in the packet of 187 bytes, which is outputted from the RS byte remover 115, and then outputs it to the data interleaver 122. Here, like the conventional broadcast system, the RS encoder/non-systematic RS encoder 121 performs systematic RS encoding to add a parity of 20 bytes to the end of the data of 187 bytes, when the inputted data is a main data packet. When the inputted data is an enhanced data packet, the RS encoder/non-systematic RS encoder 121 determines 20 places for parity byte in the packet and then inserts the RS parity of 20 bytes in the determined parity byte place, in which the RS parity of 20 bytes are obtained through non-systematic RS encoding.

The data interleaver 122 is implemented with a convolution interleaver of byte unit, and is operated by the interleaving rule like the data interleaver 112.

The data interleaver 122 outputs its output to the parity replacer 123 and the non-systematic RS encoder 124.

It is necessary to initialize a memory of a Trellis encoding unit 125 such that the output data of the Trellis encoding unit 125, which is located the rear end of the parity replacer 123, is used as known data defined in transmitting/receiving ends. Namely, the memory of the Trellis encoding unit 125 must be initialized before the inputted known data sequence is processed by Trellis encoding.

Here, the beginning portion of the inputted known data sequence is not actual known data but the initialization data place holder which is inserted thereto in the packet formatter 102. Namely, one known data sequence is composed of initialization data place holders and actual known data. Therefore, it is necessary to generate initialization data immediately before the inputted known data sequence is processed by Trellis encoding and then to replace the initialization data place holder of a corresponding Trellis memory with the generated initialization data. Such processes are performed to maintain compatibility with the reverse direction of the conventional receiving system.

After that, the initialization data of the Trellis memory is generated such that the memory of the Trellis encoding unit 125 is initialized based on the past state of the memory. Also, the RS parity affected by the replaced initialization data is re-calculated and then the re-calculated RS parity is replaced with the RS parity outputted from the data interleaver 122.

Therefore, the non-systematic RS encoder 124 inputs a non-systematic RS parity from the data interleaver 122 and initialization data from the Trellis encoding unit 125, and calculates a new non-systematic RS parity to output it to the parity replacer 123. Here, the non-systematic RS parity is previously calculated for an enhanced packet in which initialization data place holder to be replaced with the initialization data is included. Then, the parity replacer 123 is operated such that data in the enhanced data packet selects the output of the data interleaver 122 and the RS parity selects the output of the non-systematic RS encoder 124, thereby outputting the selected outputs to the Trellis encoding unit 125.

On the other hand, when the parity replacer 123 inputs main data packet or an enhanced data packet in which an initialization data place holder to be replaced is not included, it selects the data outputted from the data interleaver 122 and the RS parity and then outputs them to the Trellis encoding unit 125 without change.

The Trellis encoding unit 125 converts data of byte unit to data of symbol unit and performs 12-way interleaving therefor. Afterwards, the interleaving result is processed by Trellis encoding and then outputted to the frame multiplexer 126. The detailed configuration of the Trellis encoding unit 125 will be described later.

The frame multiplexer 126 inserts a field synchronization and a segment synchronization in the output of the Trellis encoding unit 125 and then outputs it to the transmitting unit 130. The transmitting unit 130 includes a pilot inserter 131, a modulator 132, and an RF converter 133. Since the operations of the transmitting unit 130 are the same that as the conventional ones, a description therefor will be omitted in this disclosure.

Trellis Initialization

Figure 2:
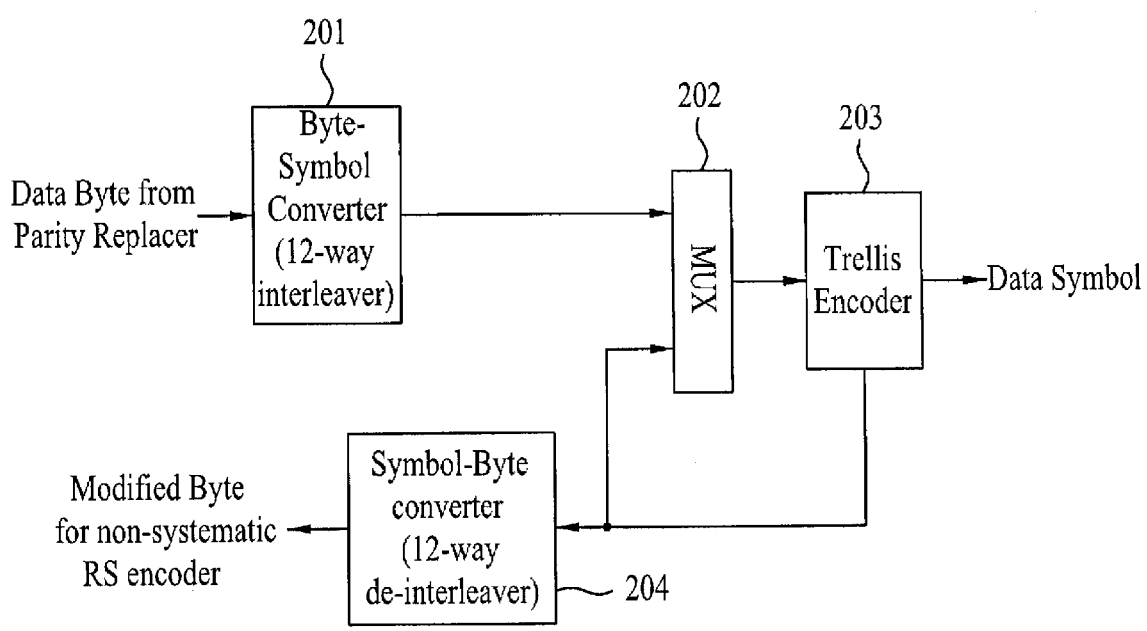
FIG. 2 illustrates a detailed diagram of a Trellis encoding unit of FIG. 1 according to an embodiment of the present invention.

FIG. 2 illustrates a detailed diagram of a Trellis encoding unit 125 of FIG. 1 according to an embodiment of the present invention.

The Trellis encoding unit 125, which can be initialized, includes a byte-symbol converter 201, a multiplexer 202, a Trellis encoder 203 for inputting inputs which are selected as the Trellis encoder 203 operates, and a symbol-byte converter 204 for converting symbol data to data of byte unit and outputting it to the non-systematic RS encoder 124, in which the symbol data is used to initialize the Trellis encoder 203.

The byte-symbol converter 201 inputs the output data of the parity replacer 123, on the basis of byte unit, and converts it to symbol unit. After that, the converting result is interleaved and then outputted to the multiplexer 202.

Generally, the output of the byte-symbol converter 201 is selected by the multiplexer 202 and then outputted to the Trellis encoder 203. However, when the interleaved data is known data, and the known data is an initialization data place holder which is included in the beginning of the successively inputted known data sequence, the Trellis encoder 203 must be initialized.

Such processes are needed because the Trellis encoder 203 has a memory and thus its next output is dependent on the present input as well as the present state of the memory. Therefore, in order to output predetermined data (i.e., known data) at a certain time, the memory of the Trellis encoder 203 must be initialized.

Namely, so that the memory of the Trellis encoder 203 can be initialized, the packet formatter 103 inserts an initialization data place holder in the beginning portion of the known data sequence, according to a data group rule. Then, the initialization data place holder is replaced with an initialization symbol in the Trellis encoder 203. Afterwards, the memory of the Trellis encoder 203 is initialized on the basis of the initialization data. Therefore, from the time point of the initialization, the output of the Trellis encoder 203 can be the known data which is encoded to comply with the transmitting/receiving ends.

The Trellis encoder 203 can generate an input symbol value for initialization according to its own memory value. Afterwards, the generated symbol value is outputted to the multiplexer 202 and the symbol-byte converter 204.

The multiplexer 202 selects an initialization symbol instead of the inputted symbol to output them to the Trellis encoder 203, when the inputted data, which is interleaved and converted to a symbol, is an initialization data place holder. Here, the initialization symbol is outputted from the Trellis encoder 203. For the other cases, the multiplexer 202 selects the symbols outputted from the byte-symbol converter 201 and then outputs them to the Trellis encoder 203.

The symbol-byte converter 204 inputs initialization symbols outputted from the Trellis encoder 203 and then performs 12-way deinterleaving therefor to convert them to symbol byte unit. After that, the converting result is outputted to the non-systematic RS 124 to re-calculate an RS parity.

Pre-Process

Figure 3:
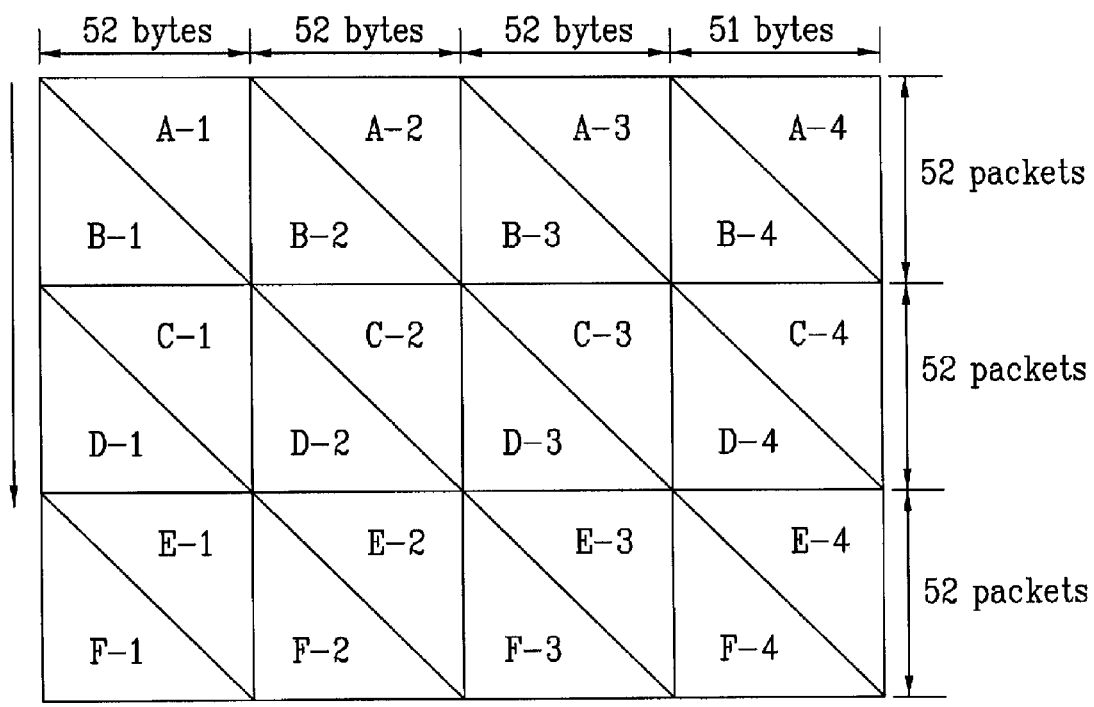
FIG. 3 illustrates a representation of data configuration at an input end of a data interleaver in a digital broadcast transmitting system according to the present invention.
Figure 4:
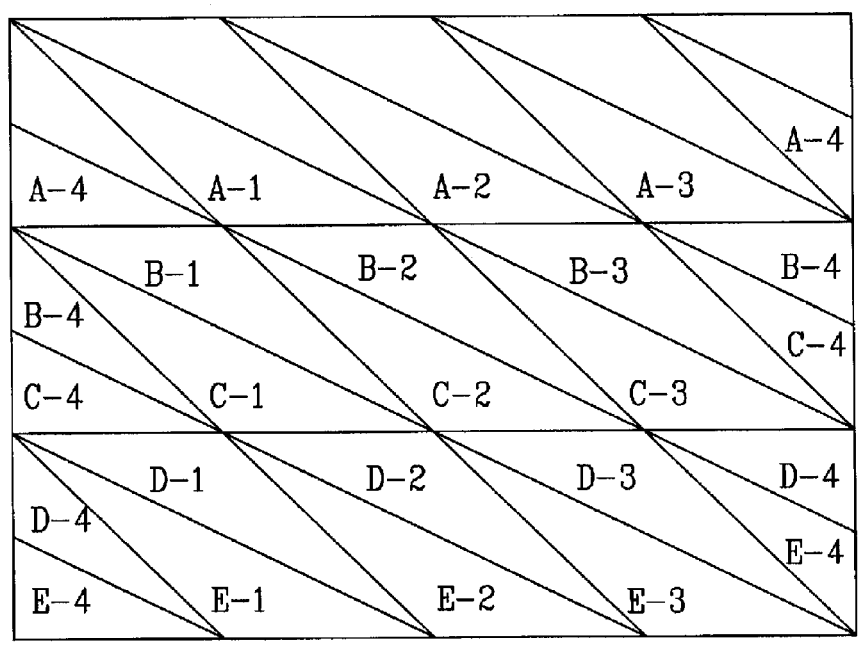
FIG. 4 illustrates a representation of data configuration at an output end of a data interleaver in a digital broadcast transmitting system according to the present invention.

FIG. 3 and FIG. 4 illustrate representations of data configuration at input and output ends of data interleavers 112 and 122, respectively, in a digital broadcast transmitting system according to the present invention. More specifically, as shown in FIG. 3, the data interleaver inputs data, based on packet sequence, from top to bottom and from left to right. Also, as shown in FIG. 4, the data interleaver outputs data from top to bottom and from left to right. Namely, as shown in FIG. 3, the data interleaver outputs A first, and then combination of B and C, combination of D and E, and F last, thereby outputting data as shown in FIG. 4.

Afterward, when main data and enhanced data are multiplexed on the basis of packet unit, and then a plurality of enhanced data packets are grouped to be transmitted, 104 packets of A, B, C, and D are formed as a single data group and then transmitted, as shown in FIG. 3. In this case, when analyzing configuration of the output data of the data interleaver of FIG. 4, the enhanced data in the regions B and C can be continuously and successively outputted, but the enhanced data in the region A or D can be outputted thereto, in a state in which the enhanced data is combined with main data.

In the present invention, the data group is stratified into three parts, Head, Body and Tail. Namely, on the basis of output of the data interleaver, the Head is firstly outputted from the data group, the Body is outputted after the Head, and the Tail is outputted last. Here, on the basis of the time after performing data interleaving, the Body is allocated to include a part of or all of the regions where the enhanced data in the data group are continuously and successively outputted. Here, the Body may include a region where enhanced data is non-continuously outputted.

Figure 5:
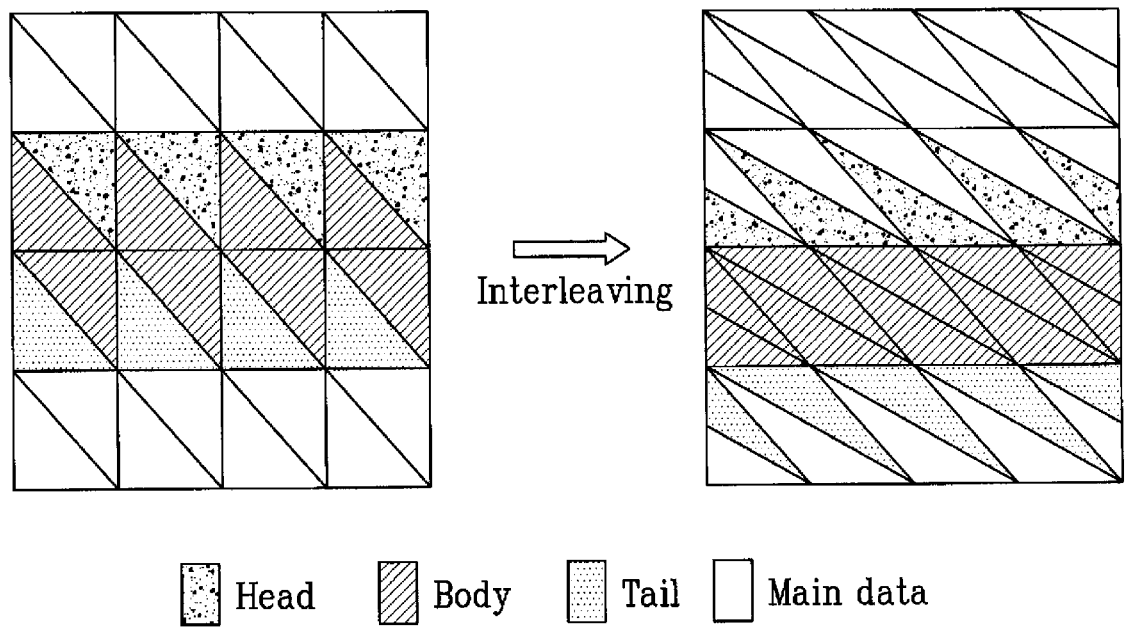
FIG. 5 illustrates a data group according to the present invention.

FIG. 5 illustrates a data group according to the present invention, in which a predetermined number of enhanced data packets form a group, such that the group can be divided into Head, Body, and Tail regions.

Left figure of FIG. 5 shows data configuration before performing data interleaving, and right figure of FIG. 5 shows data configuration after performing data interleaving.

FIG. 5 illustrates a diagram for describing a case where 104 packets form a data group. Since the data interleaver is periodically operated on the basis of 52 packet units, the data group can be formed on the basis of 52 packet times.

Also, as shown in FIG. FIG. 5, the Body region for configuration of data, which is outputted from the output end of the data interleaver, forms a rectangular shape. Namely, the Body region is set in the data group, such that it cannot be mixed in the main data region while it is processed, but it can be formed by only enhanced data.

The data group is divided into three regions to be used for different purposes. Namely, since the regions corresponding to the Bodies of FIG. 5 are configured by only enhanced data without interference of main data while they are processed, they have relatively high receiving performance. On the other hand, since the enhanced data in the Head and Tail regions may be mixed with main data while the outputs are outputted from the data interleaver, the receiving performance of the Head and Tail regions is relatively lower than that of the Body region.

In addition, in a system in which known data is inserted in the enhanced data and then transmitted, when successive long segments of known data are periodically inserted to the enhanced data, the enhanced data can be inserted to a region in which main data is not mixed therewith, on the basis of the output sequence of the data interleaver. Namely, as shown in FIG. 5, known data with a predetermined length can be periodically inserted to the Body regions. However, it is difficult to periodically insert the known data to the Head and Tail regions, and also, it is impossible to continuously insert a relatively long segment of known data thereto. Here, the initialization data place holder for initializing the memory of the Trellis encoder 203 is allocated to the beginning portion of the known data sequence.

Also, when an enhance data group is divided into Head, Body and Tail regions, the respective regions can take charge of different services. For example, when enhanced data is divided into high priority enhanced data and low priority enhanced data, the high and low priority enhanced data can be allocated to proper regions of the Head, Body and Tail regions in the data group, respectively. Namely, the high priority enhanced data is allocated to the Body region and the low priority enhanced data is allocated to the Head and Tail regions.

Therefore, when the enhanced data is inputted, the pre-processor 101 can perform pre-processes for the inputted enhanced data, such as block encoding, block interleaving, byte expansion, etc., considering types of inputted enhanced data and types of data allocated to the respective regions in the data group. Also, the pre-processor 101 can perform pre-processes for the inputted enhanced data, considering one of types of inputted enhanced data and types of data allocated to the respective regions in the data group.

Figure 6:
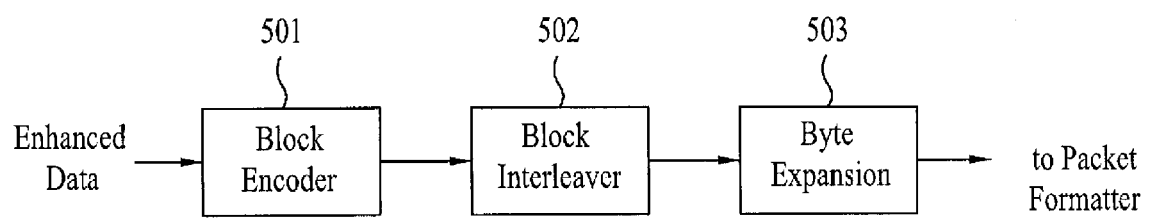
FIG. 6 and FIG. 7 illustrate schematic block diagrams of embodiments of the pre-processor of FIG. 1.
Figure 7:
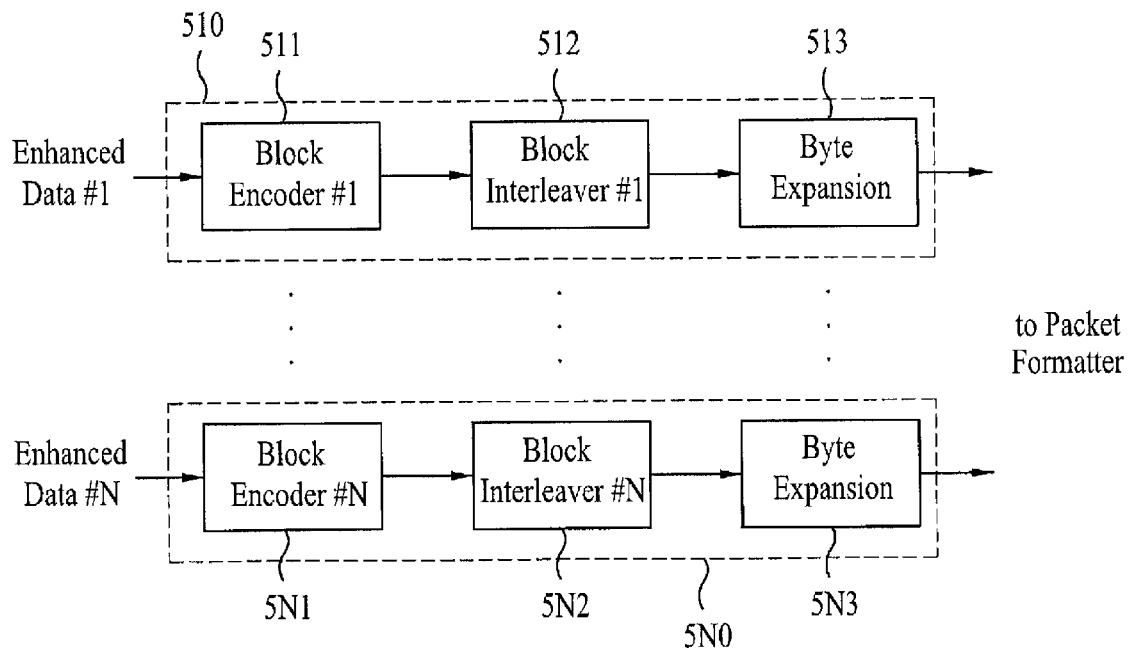

FIG. 6 and FIG. 7 illustrate schematic block diagrams of embodiments of the pre-processor 101 of FIG. 1. More specifically, FIG. 6 shows a pre-processor for integratedly performing pre-process regardless of types of inputted enhanced data, and FIG. 7 shows an pre-processor for individually performing pre-processes according to types of inputted enhanced data.

As shown in FIG. 6, the pre-processor 101 includes a block encoder 501, a block interleaver 502, and a byte expansion unit 503.

The block encoder 501 serves to encode inputted enhanced data on the basis of block encoding. For example, the block encoder 501 is implemented with an RS encoder, a convolution encoder, a low density parity check (LDPC) encoder, etc., which can use block codes. Also, the block encoder may selectively adopt a block interleaver 502 according to implementation objectives.

Application of the block interleaving is related to entire system performance. For example, random interleaving, etc., can be used therefor.

Here, so that the block encoder 501 performs encoding on the basis of block unit and the block interleaver 502 performs block interleaving, block size must be determined.

For example, the block size may be set to bit number of enhanced data included in the Body region in the data group, and also the block size may be set to bit number of enhanced data included in the Head and Tail regions. Here, the block size for enhanced data in the Body region is approximately similar to that in the Head and Tail regions. Such relation can be shown in FIG. 5. On the other hand, the block sizes are just an embodiment of the present invention. For example, when the beginning and end of a block are determined such that the enhanced data can have limited lengths, any size of blocks can be chosen. Therefore, the present invention will not be limited by such embodiments.

After encoding on the basis of a block coding fashion, the block interleaved data undergoes byte expansion through insertion of null bits in the byte expansion unit 503. Here, the byte expansion unit 503, which is implemented as an embodiment of the present invention, can extend one byte to two bytes, four bytes, or any bytes, as at least one of insertion of null bits and a repetition operation is performed.

As shown in FIG. 7, the pre-processor 101 includes a certain number of block encoders, a certain number of block interleavers and a certain number of a byte expansion unit, based on the number N of types of enhanced data, such that the respective elements can perform pre-processes. Here, according to types of enhanced data, the block encoders, block interleavers and byte expansion units perform different block encodings, block interleavings, and byte expansions.

When the enhanced data is classified into high priority enhanced data and low priority enhanced data, the pre-processor 101 includes at least two encoders each of which is formed by a block encoder, a block interleaver and a byte expansion unit.

As shown in FIG. 7, a first encoder denoted by reference numeral 510 encodes high priority enhanced data to perform byte expansion therefor, and a second encoder denoted by reference numeral 5N0 encodes low priority enhanced data to perform byte expansion therefor. Also, the high priority enhanced data is allocated to the Body region in the data group in the packet formatter 102 and the low priority enhanced data is allocated to the Head and Tail regions.

In this case, the encoding rate of the block encoder 511 in the first encoder 510 is set higher than that of the block encoder 5N1 in the second encoder 5N0, such that the data transmission rate can be increased. Because relatively high receiving performance is expected in the Body region and relatively low receiving performance is expected in the Head and Tail regions.

On the other hand, since the Body region allocates data having high degree of importance thereto, when the encoding rate of the block encoder 511 in the first encoder 510 is set lower than that of the block encoder 5N1 in the second encoder 5N0, data transmission rate is reduced and error correction is increased.

The encoder according to an embodiment of the present invention is configured such that the block encoder 511 of the first encoder 510 is implemented with a 9/10 LDPC having an encoding rate of 9/10, an RS code, etc., and the block encoder 5N1 of the second encoder 5N0 is implemented with a 1/2 LPDC encoder, 1/2 convolution encoder, etc., each of which has an encoding rate of 1/2. On the other hand, another embodiment modified from the above embodiment can be configured such that the block encoder 511 of the first encoder 510 is implemented with a 1/2 LPDC encoder, 1/2 convolution encoder, etc., each of which has an encoding rate of 1/2 and the block encoder 5N1 of the second encoder 5N0 is implemented with a 9/10 LDPC having an encoding rate of 9/10, an RS code, etc. Here, such embodiments are just exemplary examples of the present invention. Namely, since each block encoder can be implemented with encoders having different encoding rates, the present invention will not limited by such embodiments.

After each encoder performs block coding and block interleaving according to types of enhanced data, each byte expansion unit performs byte expansion. In this case, the number of extended bytes can be identically or differently set, according to types of inputted enhanced data and types of data allocated to each region in the data group. For example, the high priority enhanced data may be extended by four bytes, and the low priority enhanced data may be extended by two bytes. Also, the enhanced data may be extended by the opposite rates, respectively, or by the same rate. Here, since such expansions can be selectively designed by the inventors, it will be easily appreciated that they cannot limit the scope of the present invention.

The enhanced data, which has undergone byte expansion in each byte expansion unit, is inputted to the packet formatter 102. Namely, the enhanced data is differently processed by pre-processing according to types of enhanced data, and then inputted to the packet formatter 102.

The packet formatter 102 allocates the inputted enhanced data to proper regions of the Head, Body, and Tail regions in the data group. For example, the high priority enhanced data can be allocated in the Body region, and the low priority enhanced data can be allocated to the Head and Tail regions.

Namely, the packet formatter 102 forms data groups, according to types of the enhanced data, such that the enhanced data can be located to a predetermined place in the Head, Body, and Tail regions after data interleaving. Also, after predefined known data (or known data place holder) and an initialization data holder are inserted to a particular place in the data group according to a particular rule, the result is outputted to the packet multiplexer 103 on the basis of MPEG packet unit of 188 byte unit.

Block Process

On the other hand, the block processor 113 performs additional encoding for only enhanced data to output it.

Namely, the block processor 113 outputs its inputs without change, when the output of the data interleaver 112 is main data, an MPEG header byte added in the packet formatter 102, and an RS parity (or an RS parity place holder) added to the enhanced data packet in the RS encoder/non-systematic RS parity place holder inserter 111.

Also, similar to the main data, the known data (or a known data place holder) and an initialization data place holder are outputted without additional encoding, but a method for processing the known data may be different from that of the main data.

For example, the packet formatter 102 inserts a known data place holder thereto, and the block processor 113 outputs known data instead of the known data place holder, in which the known data is generated in the known data generator 640 in the block processor. Also, the packet formatter 102 inserts known data thereto and then block processor 113 outputs its input without additional encoding, similar to the process of the main data.

Figure 8:
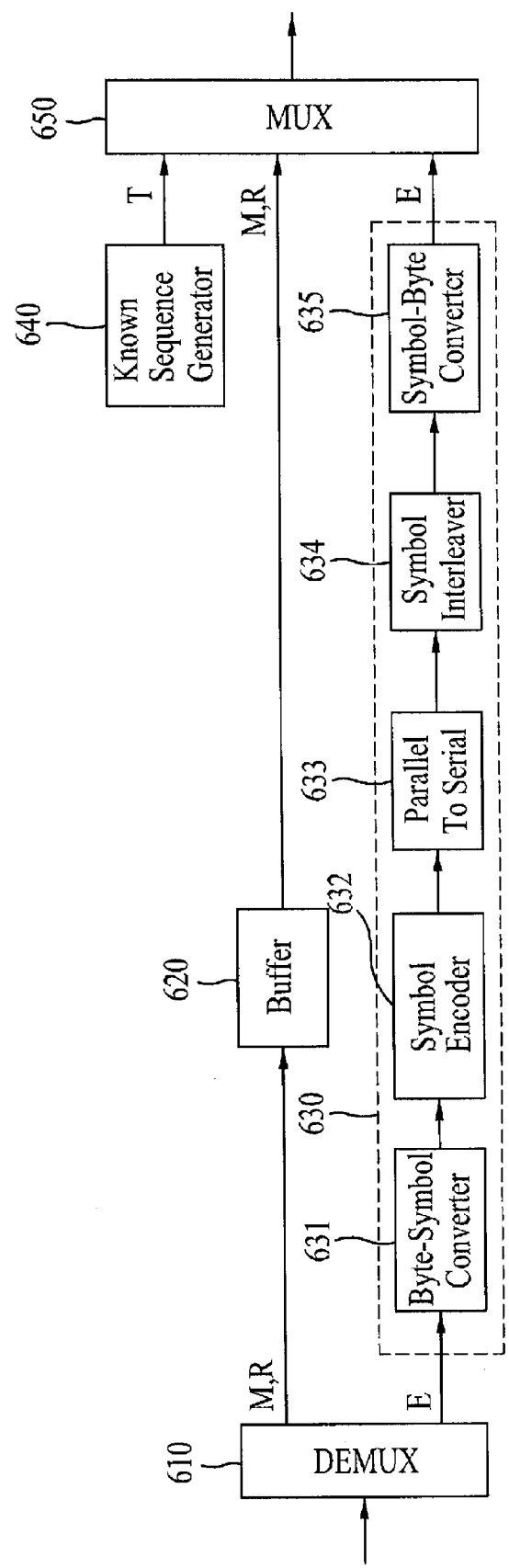
FIG. 8 and FIG. 9 illustrate schematic block diagrams of embodiments of the block processor according to the present invention.
Figure 9:
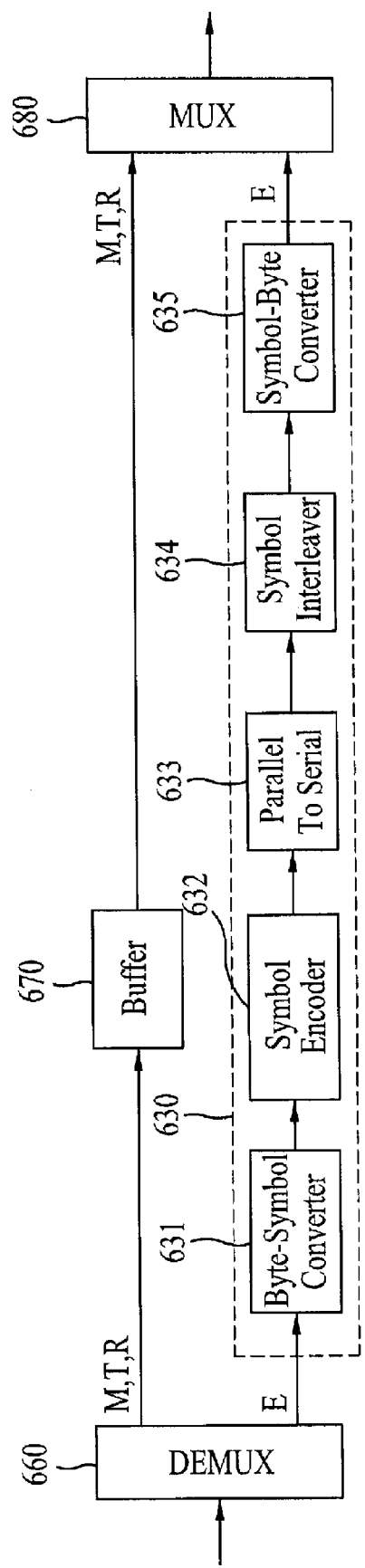

The former method is illustrated in FIG. 8, and the latter method is illustrated in FIG. 9.

Firstly, as shown in FIG. 8, the block processor 113 includes a demultiplexer 610, a buffer 620, an enhanced encoder 630, a known data generator 640, and a multiplexer 650.

The enhanced encoder 630 includes a byte-symbol converter 631, a symbol encoder 632, a parallel/serial converter 633, a symbol interleaves 634, and a symbol-byte converter 635.

As shown in FIG. 8, the demultiplexer 610 outputs its output to the buffer 620 when the inputted data is main data or an RS parity (or an RS parity place holder), and to the enhanced encoder 630 when the inputted data is enhanced data.

The buffer 620 delays main data and an RS parity (or an RS parity place holder) for a certain time, and then outputs them to the multiplexer 640. Namely, when main data or an RS parity (or an RS parity place holder) is inputted to the demultiplexer 610, the buffer 620 is used to compensate time delay which is generated while the enhanced data is additionally encoded. Afterwards, the main data, whose time difference is controlled by the buffer 620, is transmitted to the data deinterleaver 114 through the multiplexer 650.

When the known data is inputted, the known data place holder is inserted thereto in the packet formatter 102. The multiplexer 650 of the block processor 113 selects the training sequence T, which is outputted from the known data generator 640, instead of the known data place holder and then outputs it thereto. Therefore, the known data can be outputted without additional encoding. Here, the initialization data place holder, which is inserted thereto in the packet formatter 102, may be outputted without change, or the known data, which is outputted from the known data generator 640, may instead be outputted thereto. In this case, the known data, which is outputted therefrom instead of the initialization data place holder, is replaced with an initialization symbol in the Trellis encoding unit 125.

On the other hand, the byte-symbol converter 631 of the enhanced encoder 630 converts the enhanced data byte to four symbols and then outputs them to the symbol encoder 632. The symbol encoder 632 is a G/H encoder which encodes G bits of the enhanced data to H bits to output them. For example, when 1 bit of the enhanced data is encoded to 2 bits to output it, G is 1 and H is 2. Also, when 1 bit of the enhance data is encoded to four bits to be outputted, G is 1 and H is 4.

The symbol encoder 632 performs encoding only for bits having effective data in the form of input symbols.

For example, assuming that one byte of enhanced data is extended to two bytes as null bits are inserted among the bits in the pre-processor 101. Then, the symbol encoder 632 encodes only effective bits of symbols having effective data bits and null bits and then outputs encoded two bits. In this case, the symbol encoder is operated as a 1/2 encoder.

As another embodiment of the present invention, assuming that one byte of enhanced data is extended to four bytes as null bits are inserted among bits in the pre-processor 101. Then, the symbol encoder 632 encodes only effective data bits of two symbols, which is composed by three null bits and one effective data bit, and then outputs the encoded result of four bits. Also, as a further embodiment of the present invention, the symbol encoder 632 encodes only effective data bits in a symbol composing null bits and effective data bits to generate two bits and then repeatedly places the encoded two bits, thereby outputting four bits. In addition, as yet another embodiment of the present invention, from a symbol composing of null bits and effective data bits, effective data bits are encoded twice at 1/2 encoding rate to output four bits while the encoded symbols are outputted. In these cases, the symbol encoders are operated as a 1/4 encoder.

Namely, the lengths of the enhanced data at the input/output ends of the symbol encoders 632 are identical to each other. Also, when the effective data bits are outputted at 1/4 encoding rate, the error correction of 1/4 encoding rate is higher than that of a case where effective data bits are outputted at 1/2 encoding rate.

Figure 10:
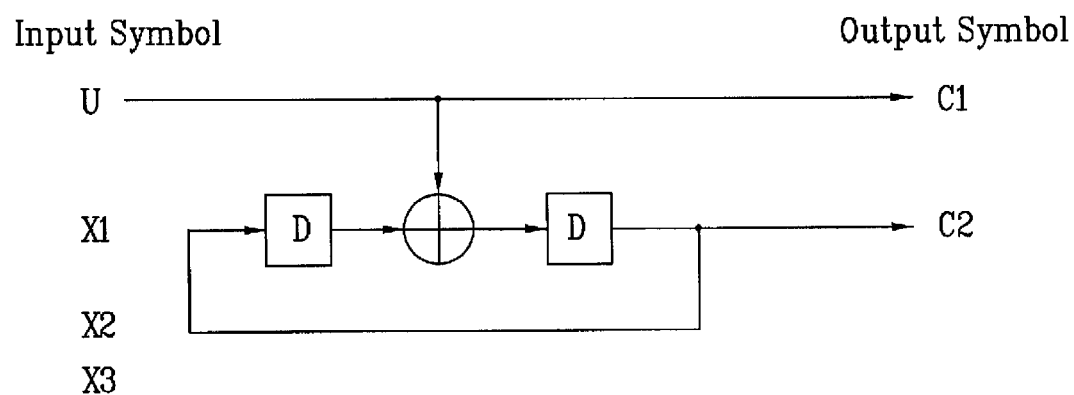
FIG. 10 and FIG. 11 illustrate schematic block diagrams of a symbol encoder according to the present invention.
Figure 11:
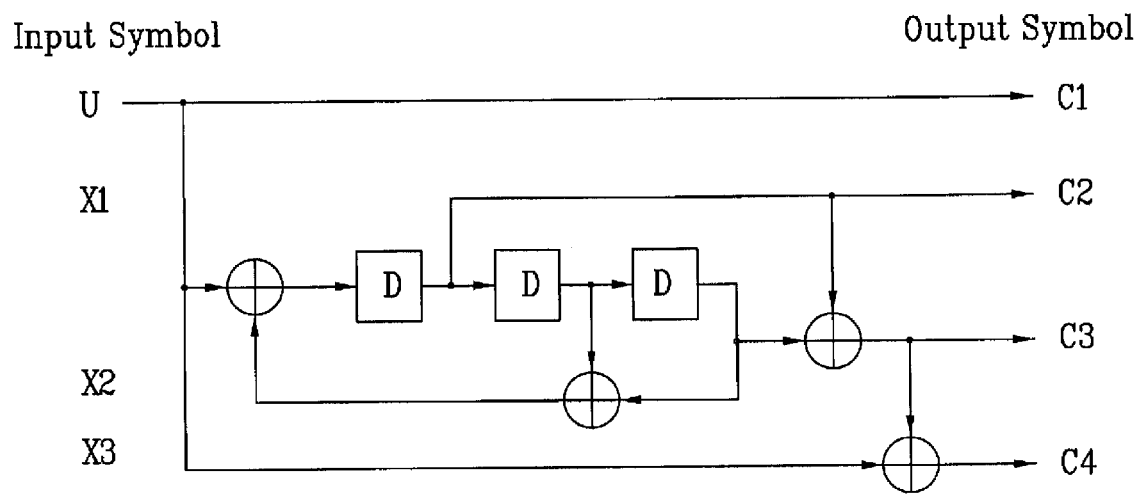
Figure 12:
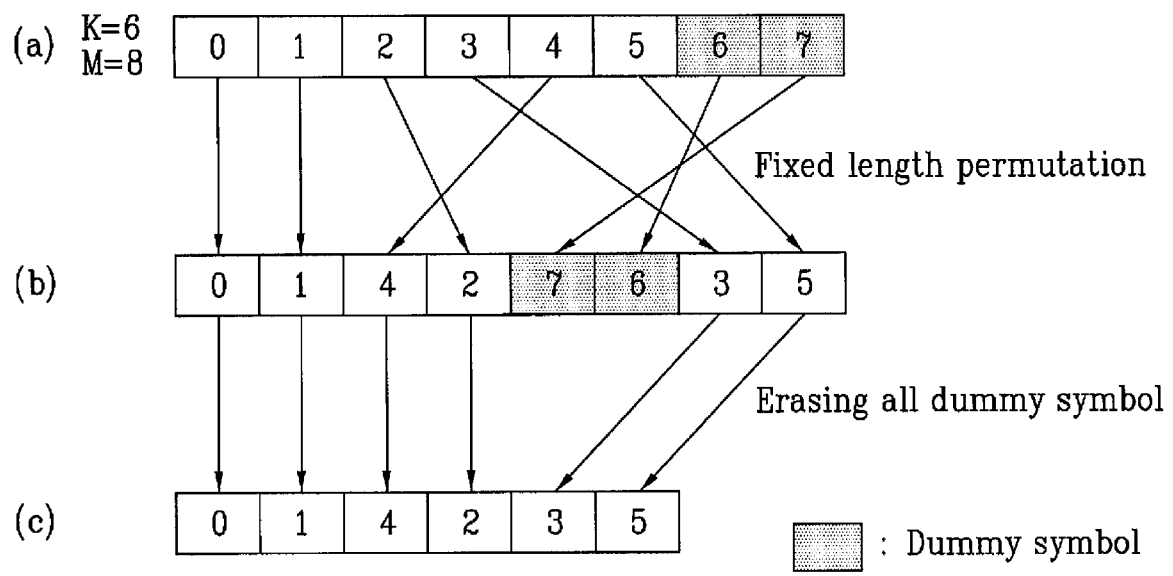
FIG. 12 illustrates diagram for describing symbol interleaving according to the present invention.

FIG. 10 and FIG. 11 illustrate schematic block diagrams of embodiments of a symbol encoder 632 according to the present invention.

As shown in FIG. 10, the symbol encoder includes two memories D and an adder, to have four memory states (i.e., 00, 01, 10, 11). The symbol encoder encodes only an effective data bit U among inputs symbols and then outputs two symbol bits, C1 and C2. Namely, the effective data bit U is outputted as an output upper bit C1, which is not changed from the effective data bit U, and simultaneously, outputted as an output lower bit C2 which is generated as the effective data bit U is encoded.

When the pre-processor 101 has performed two byte expansion, the symbol encoder inputs a symbol composed of a null bit X1 and an effective data bit U, and then encodes the effective data bit U to output an output bit C1C2.

On the other hand, when the pre-processor 101 has performed four byte expansion, the symbol encoder inputs two symbols (i.e., four bits), simultaneously, one of which is composed of a null bit and an effective bit and another of which is composed of two null bits. Afterwards, only effective data bit U among the two symbols U, and X1-X3, is encoded to generate an output bit C1C2. After that, the output bit C1C2 is repeatedly placed to generate a final output bit C1C2C1C2 to be outputted. As another embodiment of the present invention, the symbol encoder encodes only the effective data bit U among the two symbols U, and X1-X2, twice, at 1/2 encoding rate, to generate a final output bit C1C2C1C2 to be outputted. Here, the two symbols are outputted in parallel.

Therefore, the symbol encoder of FIG. 10 may be also operated at a 1/4 encoding rate. Here, the X1-X3 are null bits inserted thereto in the pre-processor 101.

As shown in FIG. 11, the symbol encoder includes three memories D and four adders, such that it can encode only an effective data bit U of input symbols to output four bits C1-C4. Namely, the effective data bit U is outputted as an output upper bit C1, which is not changed from the effective data bit U, and simultaneously, outputted as an output lower bit C2C3C4 which is generated as the effective data bit U is encoded.

When the pre-processor 101 has performed two byte expansion, only the output bit C1C2 is selected on the basis of symbol unit and then outputted.

On the other hand, when the pre-processor 101 has performed four byte expansion, the symbol encoder of FIG. 11 inputs two symbols (i.e., four bits), simultaneously, one of which is a symbol composed of a null bit and an effective bit and another of which is a symbol composed of two null bits. After that, only the effective data bit U of the two symbols U and X1-X3 is encoded to output an output bit C1C2C3C4.

As such, the lengths of enhanced data at the input/output ends of the symbol encoder 632 are identical to each other, as shown in FIG. 10, and FIG. 11. For example, when the pre-processor 101 has performed two byte expansion, execution of such process indicates that the null bit and the effective data bit are composed in the enhanced data at a ratio of 1:1. In this case, one symbol composed of a null bit X1 and an effective data bit U is inputted, and only the effective data bit U is encoded to output two output bits C1C2. Namely, the input symbol composed of U and X1 is replaced with an output symbol composed of C1 and C2 in the symbol encoder.

Also, when the pre-processor 101 has performed four byte expansion, execution of such process indicates that the null bit and the effective data bit are composed in the enhanced data at a ratio of 3:1. In this case, two symbols composed of three null bits X1X2X3 and an effective data bit U are inputted, and only the effective data bit U is encoded to output four output bits C1C2C3C4. Namely, the input symbol composed of U, X1, X2, and X3 is replaced with an output symbol composed of C1, C2, C3 and C4 in the symbol encoder.

When the symbol encoders of FIG. 10 and FIG. 11 have been operated at a 1/2 encoding rate, the outputs of the symbol encoders bypass the rear end of the parallel/serial converter 633 to be inputted to the symbol interleaver 634. In this case, the parallel/serial converter 633 will be removed therefrom. Also, when the symbol encoders of FIG. 10 and FIG. 11 have been operated at a 1/4 encoding rate, the outputs of the symbol encoders are converted to serial symbols in the rear end of the parallel/serial converter 633 and then inputted to the symbol interleaver 634.

More specifically, when the symbol encoder is operated at 1/4 encoding rate, it outputs two symbols i.e., four bits, in parallel, and the symbol interleaver 634 performs interleaving on the basis of symbol unit, i.e., two bit unit. Therefore, the parallel/serial converter 633 converts the two symbols inputted in parallel to serial symbols of symbol unit to sequentially output the two symbols to the symbol interleaver 634.

The symbol interleaver 634 inputs the output of the parallel/serial converter 633 and performs block interleaving therefor on the basis of symbol unit.

Here, the symbol interleaver 634 may be implemented with any interleavers which can rearrange sequence of interleaved symbols, structurally.

FIG. 8(a) to FIG. 8(c) illustrate diagrams for describing symbol interleaving according to the present invention, which is performed by a variable length symbol interleaver which can be applicable for symbols having various lengths, which have undergone rearrangement of sequences thereof.

FIG. 8(a) to FIG. 8(c) show symbol interleavings when K=6 and M=8. The K denotes the number of symbols, which are outputted from the parallel/serial converter 633, to perform symbol interleaving. The M is the number of symbols which are actually interleaved in the symbol interleaver 634.

The symbol interleaver 634 of the present invention must satisfy the conditions of M≧K, for M=$2^n$. When there is a difference between K and M, an interleaving pattern is formed as null or dummy symbol is added thereto by the difference (M-K).

Therefore, the K is block size of symbols, which are actually inputted to the symbol interleaver 634, to perform interleaving, and the M is interleaving unit for interleaving according to the interleaving pattern which is generated in the symbol interleaver 634.

FIG. 8(a) to FIG. 8(c) show symbol interleavings when K is 6 and M is 8. Therefore, as shown in FIG. 8(a), two symbols have null bits added thereto to form an interleaving pattern.

The following equation (1) describes a process in which the symbol interleaver 634 sequentially inputs symbols of K whose sequence will be rearranged and obtains M satisfying the conditions of M≧K, for M=$2_n$ to form an interleaving pattern, such that the sequence of the symbols can be rearranged.

$$P(i)=\{S \times i \times (i+1)/2\} \bmod M, \text{ for all places} \quad (1)$$

where M≧K, M=$2^n$, and n and S are natural numbers. FIG. 8(a) to FIG. 8(c) show interleaving patterns and interleavings therefor, when S=89 and M=8.

As shown in FIG. 8(b), the sequence of K input symbols and (M-K) null symbols is rearranged on the basis of M symbol unit, using the equation (1). After that, as shown in FIG. 8(c), places of the null symbols are removed from the symbols of FIG. 8(b), such that the symbols can be rearranged using the following equation (2). Afterwards, the interleaving symbols based on the rearranged sequence are outputted to the symbol-byte converter 635.

$$P(i)>K-1, \text{ then } P(i) \text{ is removed/rearranged} \quad (2)$$

After that, the symbol-byte converter 635 converts the output symbols of the symbol interleaver 634 to bytes to output them to the multiplexer 650.

The multiplexer 650 selects data outputted from the buffer 620 when the inputted data is main data or an RS parity (or an RS parity place holder), and enhanced data when the inputted data is the enhanced data which is encoded in the enhanced encoder 630 and then outputted therefrom. Also, the multiplexer 650 selects training sequence from the known data generator 635 to output it to the deinterleaver 114, when the inputted data is a known data place holder (or known data).

FIG. 8 and FIG. 9 are identical to each other, except for a known data processing part. Namely, FIG. 9 is identical to FIG. 8 except that, when the inputted data is known data, the demultiplexer 660 outputs the known data to the buffer 670 such that the buffer 670 can delay a certain time and then output it to the deinterleaver 114 through the multiplexer 680. Therefore, the detailed description for FIG. 9 will be omitted.

Such processes are performed under the assumption that the known data is already inserted in the enhanced data packet by the packet formatter 102.

Figure 13:
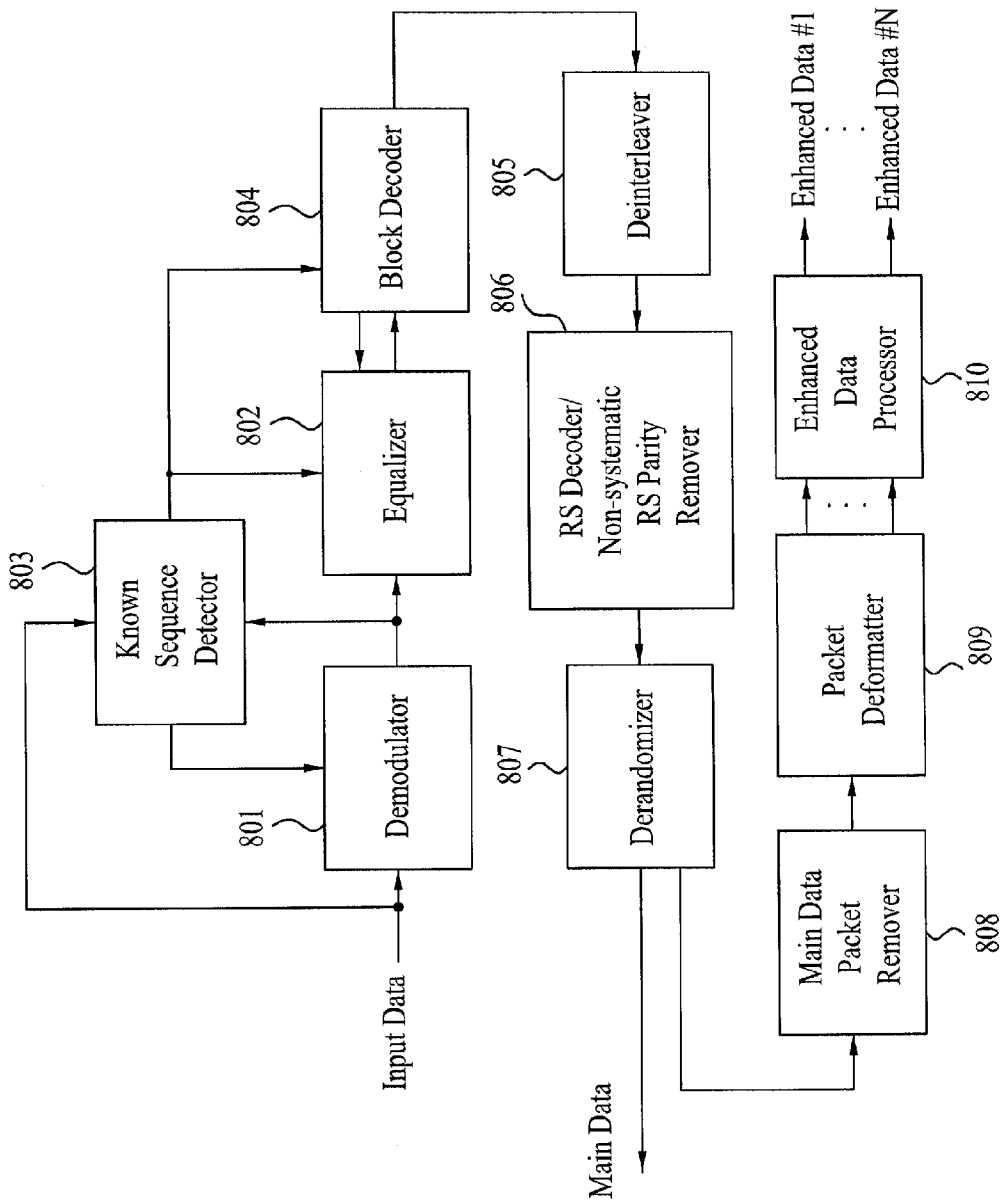
FIG. 13 illustrates a schematic block diagram of a demodulating unit included a digital broadcast receiving system according to an embodiment of the present invention.

FIG. 13 illustrates a schematic block diagram of a demodulating unit included a digital broadcast receiving system according to an embodiment of the present invention. Namely, the demodulating unit performs receiving, modulating, and equalizing for the data transmitted from the digital broadcast transmitting system, and then restores the original data.

More specifically, the demodulating unit includes a demodulator 801, an equalizer 802, a known sequence detector 803, a block decoder 804, a data deinterleaver 805, an RS decoder/non-systematic RS parity remover 806, and a derandomizer 807.

Also, the demodulating unit may include a main data packet remover, a packet deformatter 809, and an enhanced data processor 810.

Namely, the received signal through a tuner inputs to the demodulator 801 and the known sequence detector 803. The demodulator 801 performs automatic gain control, carrier recovery and timing recovery, etc., for the inputted signal to generate a baseband signal, and then output it to the equalizer 802 and the known sequence detector 803.

The equalizer 802 compensates distortion in the channel included in the demodulated signal, and then outputs it to the block decoder 804.

Here, the known sequence detector 803 detects known data place, which is inserted in the transmitting end, from input/output data of the demodulator 801, and then outputs symbol sequence of the known data together with information of the known data place, in which the symbol sequence is generated in the known data place, to the demodulator 801, the equalizer 802, and the block decoder 804. Here, the input/output data of the demodulator 801 are indicative of data before or after performing demodulation. Also, the known sequence detector 803 outputs information to the block decoder 804, such that enhanced data, which performs additional encoding in the transmitting end, can be discriminated from the main data, which does not perform additional encoding, by the block decoder 804 in the receiving end, and such that a beginning point of a block of the enhanced encoder can be identified.

The demodulator 801 enhances its demodulation performance using the known data symbol sequence when performing timing restoration or carrier restoration. The equalizer 802 enhances its equalization performance using the known data. Also, the equalization performance may be enhanced as the decoding result of the block decoder 804 is feedback to the equalizer 802.

On the other hand, the data, which is inputted to the block decoder 804 from the equalizer 802, is main data or enhanced data. Here, the main data has undergone only Trellis encoding but has not undergone additional encoding in the transmitting end, and the enhanced data has undergone additional encoding and Trellis encoding.

When the inputted data is enhanced data or known data (or known data place holder), the block decoder 804 performs Viterbi decoding for the inputted data or hard decision for a soft decision value to output the result. Also, the transmitting end regards RS parity byte and MPEG header byte, which are added to the enhanced data packet at the transmitting end, as main data, and does not perform additional encoding therefor. Therefore, Viterbi decoding is performed or hard decision is performed for soft decision value, such that the result can be outputted.

On the other hand, when the inputted data is enhanced data, the block decoder 804 outputs a soft decision value for the inputted enhanced data. Such a process is performed to enhance performance of additional error correction decoding which is performed for the enhanced data in the enhanced data processor 810.

The enhanced data processor 810 inputs the soft decision value and then performs additional error correction decoding therefor. Namely, the enhanced data processor 810 performs error correction decoding for the enhanced data which has undergone soft decision. The error correction decoder is implemented with any of an RS decoder, a convolution decoder, a low density parity check code (LDPC) decoder or a turbo decoder for a plurality of decoding periods, etc.

Namely, when the inputted data is enhanced data, the block decoder 804 performs decoding for data which is encoded in the block processor 113 and the Trellis encoder 203 of the transmitting system. Here, the block encoder of the pre-processor 101 at the transmitting end is regarded as an outer encoder, and the Trellis encoder 203 of the block processor 113 is regarded as an inner encoder.

So that the performance of the outer encoder can be maximized when the adjacent encoded data is decoded, turbo decoding is performed between decoder for inner encoded data to output a soft decision value.

Therefore, it is preferable such that the block decoder 804 does not output a hard decision value to the enhanced data but a soft decision value.

The block decoder 804 outputs its output to the deinterleaver 805. The deinterleaver 805 performs deinterleaving and outputs the deinterleaving result to the RS decoder/non-systematic RS parity remover 806. Here, the deinterleaver 805 performs a reverse operation of the data interleaver of the transmitting end. The RS decoder/non-systematic RS parity remover 806 performs systematic RS decoding when the inputted packet is main data packet and removes non-systematic RS parity bytes from the packet when the inputted packet is enhanced data packet, to output the result to the derandomizer 807.

The derandomizer 807 inputs the output of the RS decoder/non-systematic RS parity remover 806 to generate pseudo random byte which is identical to that of the randomizer of the transmitting system and then performs a bitwise exclusive OR (XOR) operation. Afterwards, the derandomizer 807 inserts MPEG synchronization byte to each packet and then outputs it on the basis of 188 byte packet. The output of the derandomizer 807 is outputted to a main MPEG decoder (not shown) and to the main data packet remover 808, simultaneously. The main MPEG decoder decodes only a packet corresponding main MPEG. Such processes are performed because the enhanced data packet is not used in the conventional receivers or the enhanced data packet has null or reserved PID, and thus because it is not decoded in the main MPEG decoder and ignored.

However, it is difficult to perform the XOR operation between the soft decision value of the enhanced data and the pseudo random bit. Therefore, as the data outputted to the main MPEG decoder is described in detail above, the soft decision value is determined by hard decision on the basis of sign thereof, and then performs the XOR operation with the pseudo random bit to output the result. Namely, when the signs of the soft decision value are positive and negative, the decision values are set to 1 and 0, respectively. Therefore, the decision values perform the XOR operation with a pseudo random bit.

On the other hand, as the enhanced data processor 810 is described above, since soft decision is required to enhance its performance when error correction code is decoded, the derandomizer 807 generate an additional output for the enhanced data to output it to the main data packet remover 808. For example, the derandomizer 807 inverts sign of the soft decision value, and then outputs it, when the pseudo random bit is 1. Here, the pseudo random bit performs the XOR operation for the soft decision value when the enhanced data bit is 1. On the other hand, when the pseudo random bit is 1, the derandomizer 807 outputs it without change.

When the pseudo random bit is 1, the change of sign of the soft decision value is because the data bit outputted from the transmitting system is inverted. Namely, $0 \oplus 1 = 1$ and $1 \oplus 1 = 0$.

In other words, in a case that the pseudo random bit, which is generated in the derandomizer, is 1, when the pseudo random bit performs an XOR operation with the hard decision value of the enhanced data bit, its value is inverted. Therefore, when the soft decision value is outputted after its sign is changed to opposite sign.

The main data packet remover 808 takes only the soft decision value of the enhanced data packet from the output of the derandomizer 807 and then outputs it. Namely, the main data packet remover 808 removes main data packet of 188 byte unit from the output of the derandomizer 807, and then takes only the soft decision value of the enhanced data packet to output it to the packet deformatter 809.

The packet deformatter 809 removes a MPEG header having PID for enhanced data from the input data thereof to obtain a packet of 184 byte unit, in which the MPEG header is inserted thereto in the transmitting system in order to be identified with a main data packet. After that, the 184 byte packets are collected to form a group of a predetermined size, and the known data, which is inserted thereto in the transmitting system to perform demodulation and equalization, is removed from a predetermined place. Afterwards, the Head, Body, Tail regions in the data group are identified to be outputted to the enhanced data processor 810. Namely, the enhanced data, which has individually undergone pre-process in the pre-processor of the transmitting system, is identified on the basis of types and then outputted thereto.

The output of the packet deformatter 809 is inputted to the enhanced data processor 810.

The enhanced data processor 810 performs block deinterleaving and block decoding for the enhanced data which has undergone soft decision.

The enhanced data processor 810 performs a reverse operation of the pre-processor of the transmitting end. The pre-processor of the transmitting system individually performs block encoding and block interleaving for inputted enhanced data according to types of the enhanced data, and byte expansion therefor as null bits are inserted or bits are repeatedly inserted. Then, the enhanced data processor 810 performs the reverse operation of the pre-processor of the transmitting end. Namely, the enhanced data processor 810 individually processes the inputted enhanced data according to the types of the enhanced data and then outputs the enhanced data in a state where the enhanced data is identified on the basis of importance degree or priority, as the enhanced data is identified on the basis of importance degree or priority at the transmitting end. Namely, the enhanced data processor 810 removes the null bits or repeated bits from the inputted enhanced data which have undergone soft decision process, on the basis of the types thereof. Here, the null bits or repeated bits are used for byte expansion in the pre-processor. Afterwards, the enhanced data processor 810 performs block deinterleaving and block decoding for the removal of the null bits and repeated bits to output the finally processed enhanced data.

For example, the finally processed enhanced data is categorized into high priority enhanced data and low priority enhanced data to be outputted.

Figure 14:
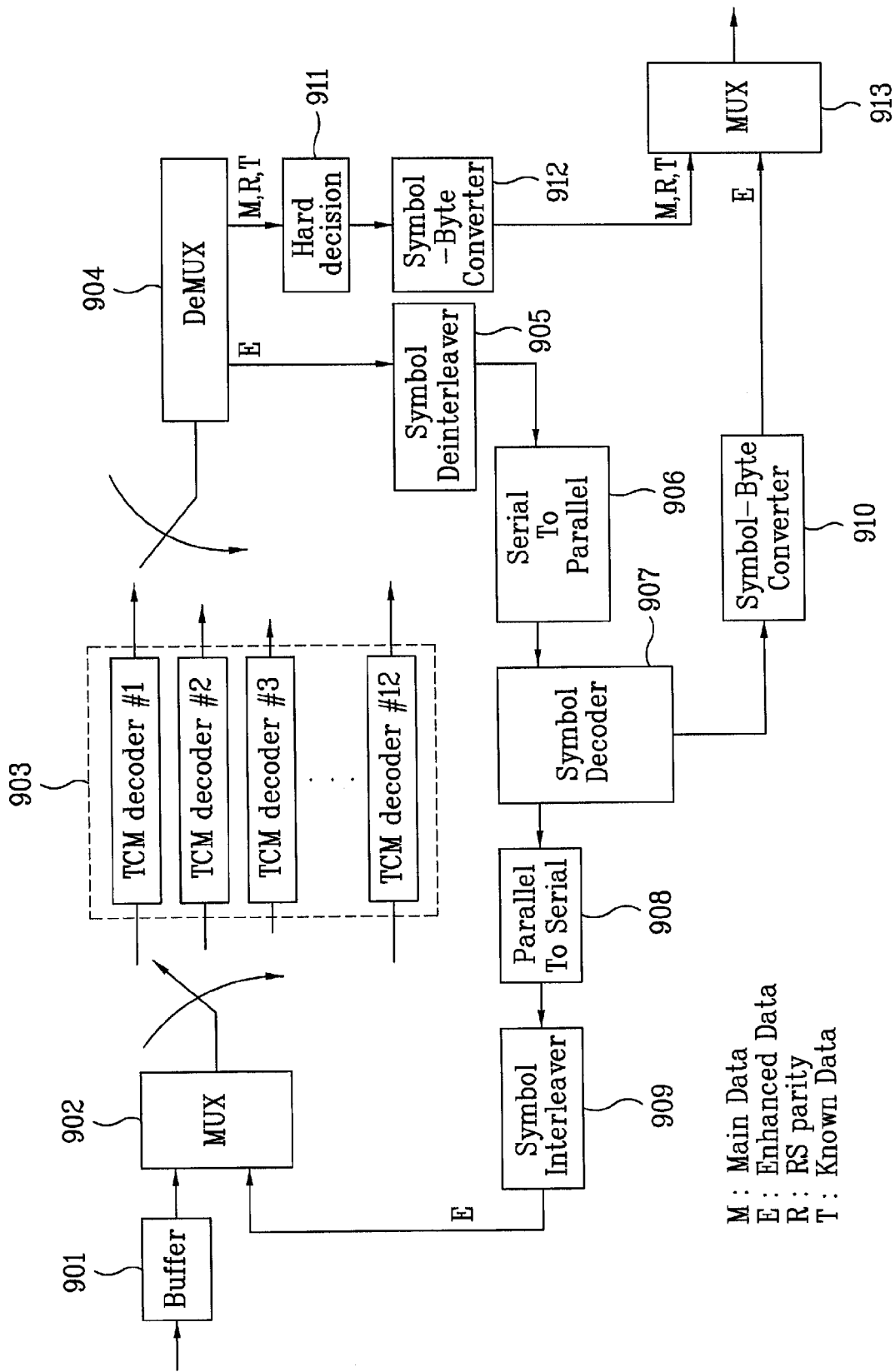
FIG. 14 illustrates a schematic block diagram of the block decoder of FIG. 13.

FIG. 14 illustrates a schematic block diagram of the block decoder 804 of FIG. 13, which performs recurrence turbo decoding for enhanced data which has undergone additional encoding at the transmitting end and enhances additional performance thereof.

The block decoder 804 includes a buffer 901, a first multiplexer 902, a Trellis decoding unit 903, a demultiplexer 904, a symbol deinterleaver 905, a serial/parallel converter 906, a symbol decoder 907, a parallel/serial converter 908, a symbol interleaver 909, symbol-byte converters 910 and 912, a hard decision unit 911, and a second multiplexer 913.

In order to correspond to the symbol decoder, the symbol interleaver, and the 12-way Trellis encoder, which are included in the transmitting end, the block decoder 804 includes the Trellis decoding unit 903, the symbol deinterleaver 905, and the symbol decoder 907. Here, the Trellis decoding unit 903 includes a plurality of 12-way Trellis Coded Modulation (TCM) decoders. Therefore, the block decoder 804 performs Trellis decoding, symbol deinterleaving and symbol decoding, which are reverse operations of the transmitting end.

Generally, the turbo decoding is performed such that symbols processed by inner decoder and outer decoder are mapped one to one. On the other hand, since the present invention is performed such that the main data, known data (or known data place holder), and RS parity (or RS parity place holder) do not undergo symbol encoding, together with the enhanced data, but are transmitted thereto, the data must be processed by structural control in the turbo decoding process.

To this end, when a soft decision value is enhanced data, the demultiplexer 904 outputs the soft decision value to the symbol deinterleaver 905. Here, the soft decision value undergoes Trellis decoding in the Trellis decoding unit 903 to be inputted to the demultiplexer 904. On the other hand, when the soft decision value is one of the main data, known data (or known data place holder), and RS parity (or RS parity place holder), it is converted to a hard decision value through the hard decision unit 911 and then outputted to the symbol-byte converter 912. The symbol-byte converter 912 converts the hard decision value, which is inputted thereto on the basis of symbol unit, to byte unit to output it to the second multiplexer 913.

Namely, the equalizer 802 outputs its output to the buffer 901 of the block decoder 804. The buffer 901 outputs its input to the demultiplexer 904 through the first multiplexer 902 and the Trellis decoding unit 903, when the inputted data is not enhanced data, or when the inputted data is not one of the main data, known data (or known data place holder) and RS parity (or RS parity place holder).

Also, the buffer 901 stores enhanced data corresponding to one block size therein when the inputted data is enhanced data. After that, the buffer 901 repeatedly outputs the enhanced data to the demultiplexer 904 through the first multiplexer 902 and the Trellis decoding unit 903 by the circulation number while turbo decoding processes are performed.

Here, the block size is identical to the interleaving size K for an actual symbol of the symbol interleaver 634, which is used in FIG. 8 and FIG. 9. The reason the block size and the interleaving size are equal is because the turbo decoding is performed between the Trellis decoding unit 903 and the symbol decoder 907.

The Trellis decoding unit 903 performs 12-way Trellis decoding to comply with 12-way Trellis encoding of the transmitting system. The output of each 12-way TCM decoder in the Trellis decoding unit 903 is a soft decision value. Here, the soft decision value can be outputted as a log likelihood ratio (LLR) which is formed as the soft decision value takes a log. The LLR means a log value for a ratio of probabilities where input bit will be 1 or 0.

The enhanced data outputted from the demultiplexer 904 is inputted to the symbol deinterleaver 905 such that it can be processed by symbol deinterleaving, which is a reverse operation of the symbol interleaver 634, in the transmitting end. The output of the symbol deinterleaver 905 is outputted to the serial/parallel converter 906.

When the enhanced data, which has undergone the symbol deinterleaving, is data which is encoded at 1/4 encoding rate in the transmitting end, the serial/parallel converter 906 outputs its two input symbols to the symbol decoder 907, simultaneously. Also, when the enhanced data is data which is encoded at 1/2 encoding rate in the transmitting end, the serial/parallel converter 906 bypasses its input symbol to the symbol decoder 907 without change. Namely, the outputs of the serial/parallel converter 906 are changed, according to symbol encoding rate of the symbol encoder 632, in the transmitting end.

Similarly, the symbol decoder 907 performs symbol decoding, which is a reverse operation of the symbol encoder 632, in the transmitting end.

Here, when decoding is completely performed by the circulation number, the output of the symbol decoder 907 is inputted to the symbol-byte converter 910 to be converted to byte unit. After that, the byte unit data is inputted to the second multiplexer 913.

On the other hand, if the circulation number for decoding is not yet performed, the output of the symbol decoder 907 is inputted to the parallel/serial converter 908. When the symbol decoded data is enhanced data which is decoded at 1/4 encoding rate, the parallel/serial converter 908 converts the two symbols inputted in parallel to one symbol unit and then sequentially outputs it. When the symbol decoded data is enhanced data which is decoded at 1/2 encoding rate, the parallel/serial converter 908 bypasses its input therethrough.

The output of the parallel/serial converter 908 is inputted to the symbol interleaver 909 and then processed by symbol interleaving of FIG. 8, to output the result to the multiplexer 902.

The multiplexer 902 outputs the enhanced data, which is outputted from the buffer 901, and the data outputted from the symbol interleaver 909, which has undergone turbo decoding, to corresponding TCM decoders of the Trellis decoding unit 903. Here, the enhanced data and the turbo decoded data are outputted to each TCM decoder, such that the same places in corresponding blocks of the enhanced data and the turbo decoded data can be outputted, together. For example, when the turbo decoded data is the third symbol in the block, it is outputted to a corresponding TCM decoder together with the third symbol in the block which is stored in the buffer 901.

The buffer 901 stores corresponding block data while recurrence turbo decoding is being performed, and delays it such that a soft decision value (for example, an LLR) of the output symbol of the symbol interleaver 909 and the symbol of the buffer 901 can be inputted to the TCM decoder on corresponding way. Here, the symbol of the buffer 901 corresponds to the sample place in the block of the output symbol.

After such processes are performed while the turbo decoding is repeatedly performed for the predetermined number of times, next block data is inputted to the buffer 901 to repeat the turbo decoding.

Namely, when the turbo decoding has been performed by the predetermined number of times, the output of the symbol decoder 907 is converted to a soft decision value of byte unit in the symbol-byte converter 910 and then outputted to the second multiplexer 913. Therefore, the block decoding process for one block is completed. Such processes are referred to as recurrence turbo decoding for convenience of description of the present invention.

Here, the number of recurrence turbo decoding can be defined in relation to the Trellis decoding unit 903 and the symbol decoder 907, considering hardware complexity and error correction performance. When the number is increased, the error correction is better but the hardware is somewhat complicated.

AS such, as the recurrence turbo decoding algorithm, as shown in FIG. 14, is performed for a plurality of decoding periods in which the symbol decoding for the enhanced data uses a Soft-Out Viterbi Algorithm (SOVA) algorithm and a Maximum A posteriori Probability (MAP) algorithm, etc., the present invention can additionally enhance total decoding performance thereof.

Figure 15:
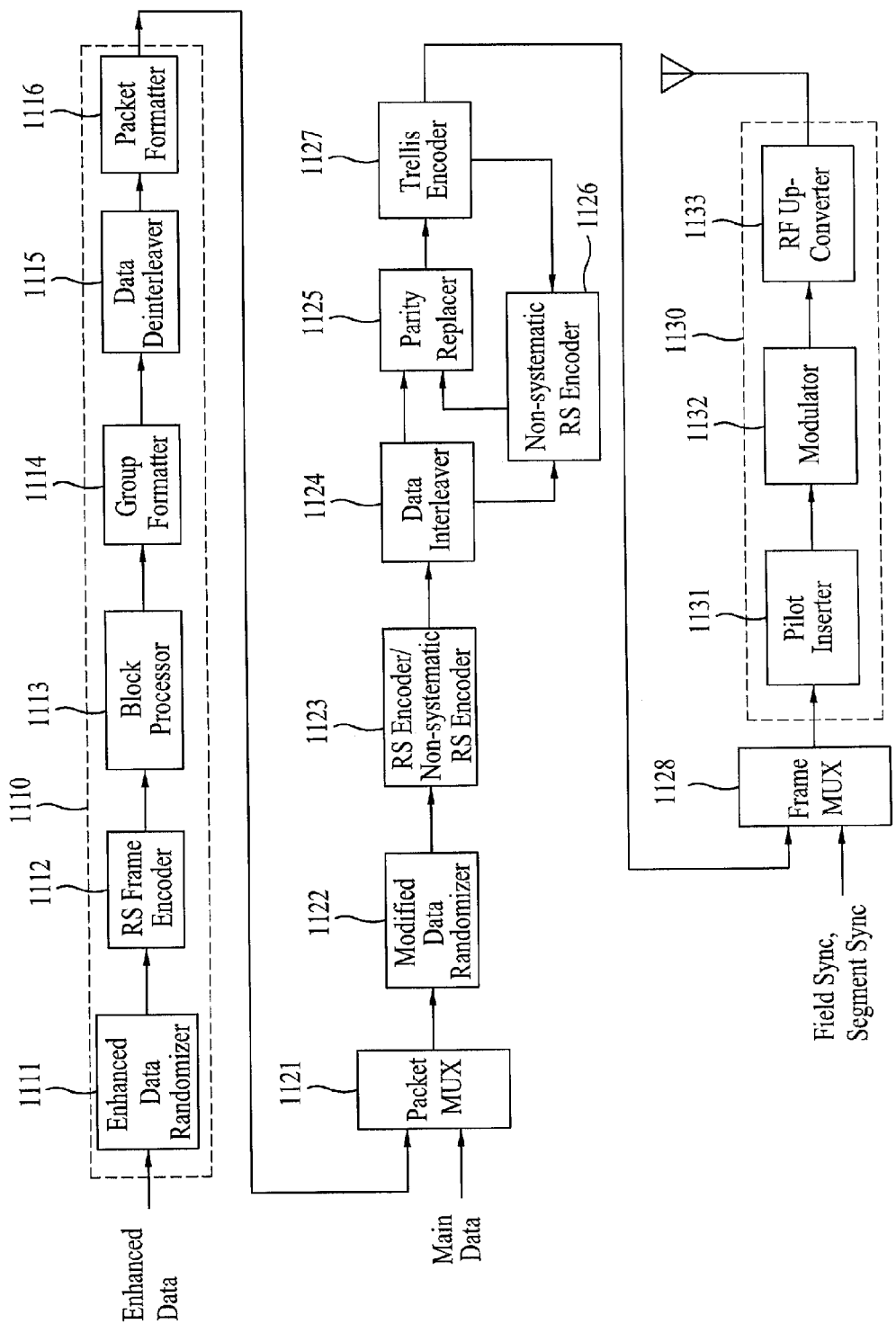
FIG. 15 illustrates a block diagram of a transmitting system according to another embodiment of the present invention.

FIG. 15 illustrates a block diagram showing the structure of a transmitting system according to an embodiment of the present invention. The digital broadcast transmitting system includes a pre-processor 1110, a packet multiplexer 1121, a data randomizer 1122, a Reed-Solomon (RS) encoder/non-systematic RS encoder 1123, a data interleaves 1124, a parity byte replacer 1125, a non-systematic RS encoder 1126, a trellis encoding module 1127, a frame multiplexer 1128, and a transmitting unit 1130. The pre-processor 1110 includes an enhanced data randomizer 1111, a RS frame encoder 1112, a block processor 1113, a group formatter 1114, a data deinterleaver 1115, and a packet formatter 1116.

In the present invention having the above-described structure, main data are inputted to the packet multiplexer 1121. Enhanced data are inputted to the enhanced data randomizer 1111 of the pre-processor 1110, wherein an additional coding process is performed so that the present invention can respond swiftly and appropriately against noise and change in channel. The enhanced data randomizer 1111 randomizes the received enhanced data and outputs the randomized enhanced data to the RS frame encoder 1112. At this point, by having the enhanced data randomizer 1111 perform the randomizing process on the enhanced data, the randomizing process on the enhanced data by the data randomizer 1122 in a later process may be omitted. Either the randomizer of the conventional broadcast system may be used as the randomizer for randomizing the enhanced data, or any other type of randomizer may be used herein.

The RS frame encoder 1112 receives the randomized enhanced data and performs at least one of an error correction coding process and an error detection coding process on the received data. Accordingly, by providing robustness to the enhanced data, the data can scatter group error that may occur due to a change in the frequency environment. Thus, the data can respond appropriately to the frequency environment which is very poor and liable to change. The RS frame multiplexer 1112 also includes a process of mixing in row units many sets of enhanced data each having a pre-determined size. By performing an error correction coding process on the inputted enhanced data, the RS frame encoder 1112 adds data required for the error correction and, then, performs an error detection coding process, thereby adding data required for the error detection process. The error correction coding uses the RS coding method, and the error detection coding uses the cyclic redundancy check (CRC) coding method. When performing the RS coding process, parity data required for the error correction are generated. And, when performing the CRC coding process, CRC data required for the error detection are generated.

The RS frame encoder 1112 performs CRC coding on the RS coded enhanced data in order to create the CRC code. The CRC code that is generated by the CRC coding process may be used to indicate whether the enhanced data have been damaged by an error while being transmitted through the channel. The present invention may adopt other types of error detection coding methods, apart from the CRC coding method, and may also use the error correction coding method so as to enhance the overall error correction ability of the receiving system. For example, assuming that the size of one RS frame is 187*N bytes, that (235,187)-RS coding process is performed on each column within the RS frame, and that a CRC coding process using a 2-byte (i.e., 16-bit) CRC checksum, then a RS frame having the size of 187*N bytes is expanded to a RS frame of 235*(N+2) bytes. The RS frame expanded by the RS frame encoder 1112 is inputted to the block processor 1113. The block processor 1113 codes the RS-coded and CRC-coded enhanced data at a coding rate of G/H. Then, the block processor 1113 outputs the G/H-rate coded enhanced data to the group formatter 1114. In order to do so, the block processor 1113 identifies the block data bytes being inputted from the RS frame encoder 1112 as bits.

The block processor 1113 may receive supplemental information data such as signaling information, which include information on the system, and identifies the supplemental information data bytes as data bits. Herein, the supplemental information data, such as the signaling information, may equally pass through the enhanced data randomizer 1111 and the RS frame encoder 1112 so as to be inputted to the block processor 1113. Alternatively, the supplemental information data may be directly inputted to the block processor 1113 without passing through the enhanced data randomizer 1111 and the RS frame encoder 1112. The signaling information corresponds to information required for receiving and processing data included in the data group in the receiving system. Such signaling information includes data group information, multiplexing information, and burst information.

As a G/H-rate encoder, the block processor 1113 codes the inputted data at a coding rate of G/H and then outputs the G/H-rate coded data. For example, if 1 bit of the input data is coded to 2 bits and outputted, then G is equal to 1 and H is equal to 2 (i.e., G=1 and H=2). Alternatively, if 1 bit of the input data is coded to 4 bits and outputted, then G is equal to 1 and H is equal to 4 (i.e., G=1 and H=4). As an example of the present invention, it is assumed that the block processor 1113 performs a coding process at a coding rate of 1/2 (also referred to as a 1/2-rate coding process) or a coding process at a coding rate of 1/4 (also referred to as a 1/4-rate coding process). More specifically, the block processor 1113 codes the received enhanced data and supplemental information data, such as the signaling information, at either a coding rate of 1/2 or a coding rate of 1/4. Thereafter, the supplemental information data, such as the signaling information, are identified and processed as enhanced data.

Since the 1/4-rate coding process has a higher coding rate than the 1/2-rate coding process, greater error correction ability may be provided. Therefore, in a later process, by allocating the 1/4-rate coded data in an area with deficient receiving performance within the group formatter 1114, and by allocating the 1/2-rate coded data in an area with excellent receiving performance, the difference in the overall performance may be reduced. More specifically, in case of performing the 1/2-rate coding process, the block processor 1113 receives 1 bit and codes the received 1 bit to bits (i.e., 1 symbol). Then, the block processor 1113 outputs the processed 2 bits (or 1 symbol). On the other hand, in case of performing the 1/4-rate coding process, the block processor 1113 receives 1 bit and codes the received 1 bit to 4 bits (i.e., 2 symbols). Then, the block processor 1113 outputs the processed 4 bits (or 2 symbols). Additionally, the block processor 1113 performs a block interleaving process in symbol units on the symbol-coded data. Subsequently, the block processor 1113 converts to bytes the data symbols that are block-interleaved and have the order rearranged.

The group formatter 1114 inserts the enhanced data outputted from the block processor 1113 (herein, the enhanced data may include supplemental information data such as signaling information including transmission information) in a corresponding area within the data group, which is configured according to a pre-defined rule. Furthermore, in relation with the data deinterleaving process, various types of places holders or known data are also inserted in corresponding areas within the data group.

At this point, the data group may be described by at least one hierarchical area. Herein, the data allocated to the each area may vary depending upon the characteristic of each hierarchical area. Additionally, each group is configured to include a field synchronization signal.

In another example given in the present invention, a data group is divided into FIRST, SECOND, and THIRD regions in a data configuration prior to data deinterleaving.

Figure 16A:
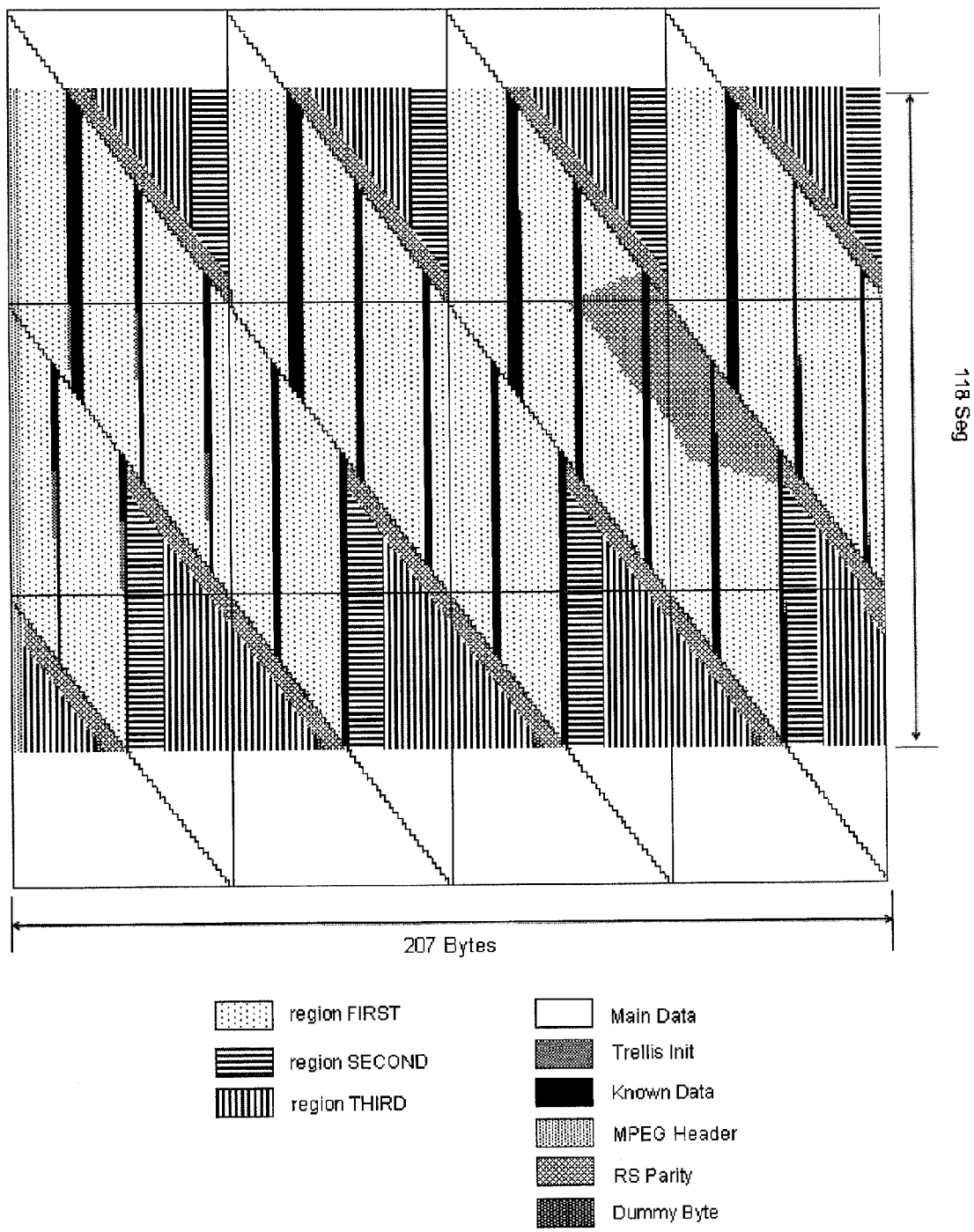
FIG. 16A and FIG. 16B illustrate examples of data configuration at before and after ends of a data interleaver in a transmitting system according to the present invention.
Figure 16B:
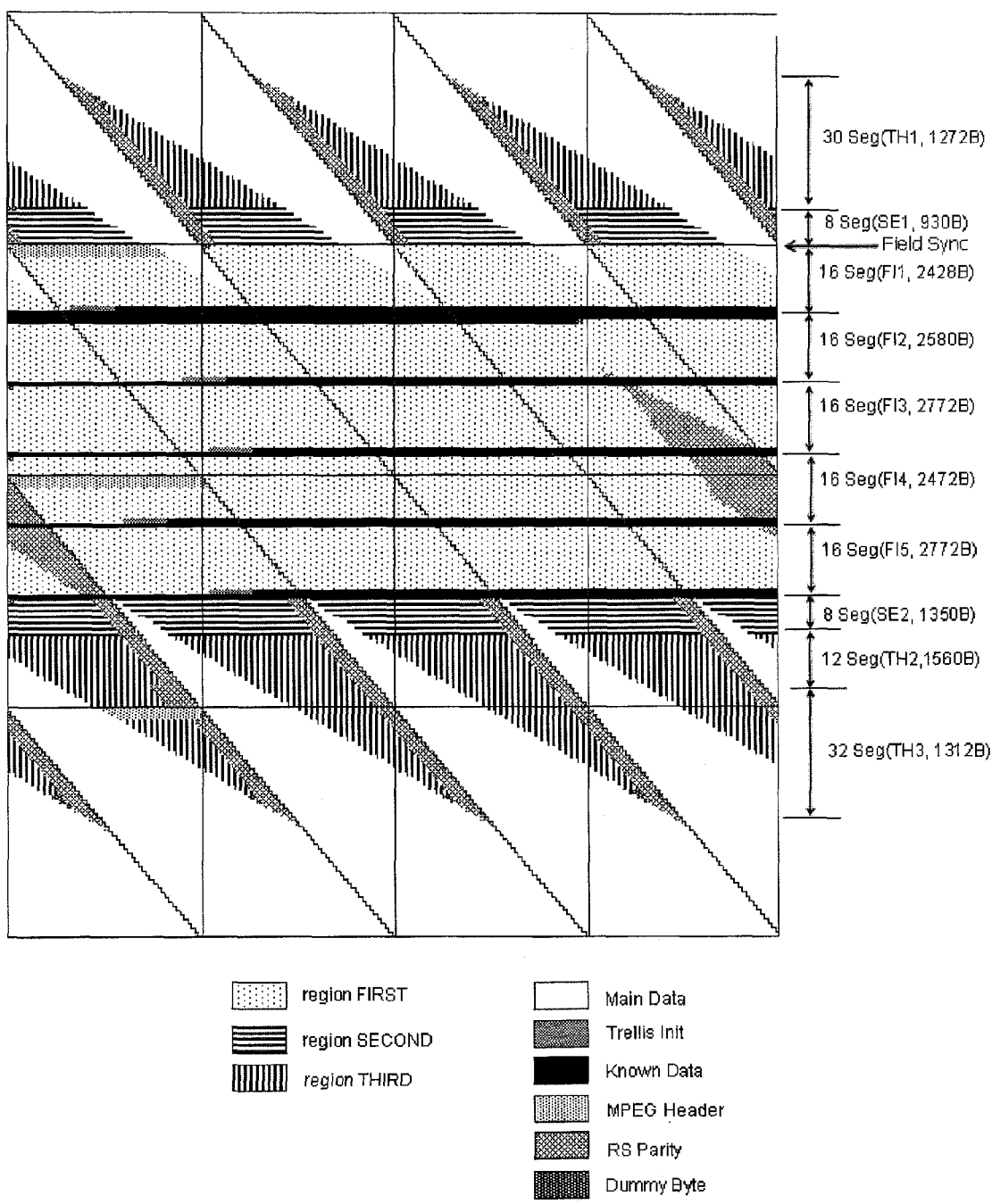

FIG. 16A illustrates an alignment of data before being data interleaved and identified, and FIG. 16B illustrates an alignment of data after being data interleaved and identified. More specifically, a data structure identical to that shown in FIG. 16B is transmitted to a receiving system. Also, the data group configured to have the same structure as the data structure shown in FIG. 16B is inputted to the data deinterleaver 1115.

As described above, FIG. 16A illustrates a data structure prior to data interleaving that is divided into 3 regions, such as region FIRST, region SECOND, and region THIRD. Also, in the present invention, each of the regions FIRST to THIRD is further divided into a plurality of regions. Referring to FIG. 16B, region FIRST is divided into 5 regions (FI1 to FI5), region SECOND is divided into 2 regions (SE1 and SE2), and region THIRD is divided into 3 regions (TH1 to TH3). Herein, regions FIRST to THIRD are identified as regions having similar receiving performances within the data group. Herein, the type of enhanced data, which are inputted, may also vary depending upon the characteristic of each region.

In the example of the present invention, the data structure is divided into regions FIRST to THIRD based upon the level of interference of the main data. Herein, the data group is divided into a plurality of regions to be used for different purposes. More specifically, a region of the main data having no interference or a very low interference level may be considered to have a more resistant (or stronger) receiving performance as compared to regions having higher interference levels. Additionally, when using a system inserting and transmitting known data in the data group, and when consecutively long known data are to be periodically inserted in the enhanced data, the known data having a predetermined length may be periodically inserted in the region having no interference from the main data (e.g., region FIRST). However, due to interference from the main data, it is difficult to periodically insert known data and also to insert consecutively long known data to a region having interference from the main data (e.g., region SECOND and region THIRD).

Hereinafter, examples of allocating data to region FIRST (FI1 to FI5), region SECOND (SE1 and SE2), and region THIRD (TH1 to TH3) will now be described in detail with reference to FIG. 16B. The data group size, the number of hierarchically divided regions within the data group and the size of each region, and the number of enhanced data bytes that can be inserted in each hierarchically divided region of FIG. 16B are merely examples given to facilitate the understanding of the present invention. Herein, the group formatter 1114 creates a data group including places in which field synchronization bytes are to be inserted, so as to create the data group that will hereinafter be described in detail.

More specifically, region FIRST is a region within the data group in which a long known data sequence may be periodically inserted, and in which includes regions wherein the main data are not mixed (e.g., FI1 to FI5). Also, region FIRST includes a region (e.g., FI1) located between a field synchronization region and the region in which the first known data sequence is to be inserted. The field synchronization region has the length of one segment (i.e., 832 symbols) existing in an ATSC system.

For example, referring to FIG. 16B, 2428 bytes of the enhanced data may be inserted in region FI1, 2580 bytes may be inserted in region FI2, 2772 bytes may be inserted in region FI3, 2472 bytes may be inserted in region FI4, and 2772 bytes may be inserted in region FI5. Herein, trellis initialization data or known data, MPEG header, and RS parity are not included in the enhanced data. As described above, when region FIRST includes a known data sequence at both ends, the receiving system uses channel information that can obtain known data or field synchronization data, so as to perform equalization, thereby providing enforced equalization performance.

Also, region SECOND includes a region located within 8 segments at the beginning of a field synchronization region within the data group (chronologically placed before region FI1) (e.g., region SE1), and a region located within 8 segments behind the very last known data sequence which is inserted in the data group (e.g., region SE2). For example, 930 bytes of the enhanced data may be inserted in the region SE1, and 1350 bytes may be inserted in region SE2. Similarly, trellis initialization data or known data, MPEG header, and RS parity are not included in the enhanced data. In case of region SECOND, the receiving system may perform equalization by using channel information obtained from the field synchronization section. Alternatively, the receiving system may also perform equalization by using channel information that may be obtained from the last known data sequence, thereby enabling the system to respond to the channel changes.

Region THIRD includes a region located within 30 segments including and preceding the $9^{th}$ segment of the field synchronization region (chronologically located before region FIRST) (e.g., region TH1), a region located within 12 segments including and following the $9^{th}$ segment of the very last known data sequence within the data group (chronologically located after region FIRST) (e.g., region TH2), and a region located in 32 segments after the region TH2 (e.g., region TH3). For example, 1272 bytes of the enhanced data may be inserted in the region TH1, 1560 bytes may be inserted in region TH2, and 1312 bytes may be inserted in region TH3. Similarly, trellis initialization data or known data, MPEG header, and RS parity are not included in the enhanced data. Herein, region THIRD (e.g., region TH1) is located chronologically earlier than (or before) region FIRST.

Since region THIRD (e.g., region TH1) is located further apart from the field synchronization region which corresponds to the closest known data region, the receiving system may use the channel information obtained from the field synchronization data when performing channel equalization. Alternatively, the receiving system may also use the most recent channel information of a previous data group. Furthermore, in region THIRD (e.g., region TH2 and region TH3) located before region FIRST, the receiving system may use the channel information obtained from the last known data sequence to perform equalization. However, when the channels are subject to fast and frequent changes, the equalization may not be performed perfectly. Therefore, the equalization performance of region THIRD may be deteriorated as compared to that of region SECOND.

When it is assumed that the data group is allocated with a plurality of hierarchically divided regions, as described above, the block processor 1113 may encode the enhanced data, which are to be inserted to each region based upon the characteristic of each hierarchical region, at a different coding rate. For example, the block processor 1113 may encode the enhanced data, which are to be inserted in regions FI1 to F15 of region FIRST, at a coding rate of 1/2. Then, the group formatter 1114 may insert the 1/2-rate encoded enhanced data to regions FI1 to FI5.

The block processor 1113 may encode the enhanced data, which are to be inserted in regions SE1 and SE2 of region SECOND, at a coding rate of 1/4 having higher error correction ability as compared to the 1/2-coding rate. Then, the group formatter 1114 inserts the 1/4-rate coded enhanced data in region SE1 and region SE2. Furthermore, the block processor 1113 may encode the enhanced data, which are to be inserted in regions TH1 to TH3 of region THIRD, at a coding rate of 1/4 or a coding rate having higher error correction ability than the 1/4-coding rate. Then, the group formatter 1114 may either insert the encoded enhanced data to regions TH1 to TH3, as described above, or leave the data in a reserved region for future usage.

In addition, the group formatter 1114 also inserts supplemental data, such as signaling information that notifies the overall transmission information, other than the enhanced data in the data group. Also, apart from the encoded enhanced data outputted from the block processor 1113, the group formatter 1114 also inserts MPEG header place holders, non-systematic RS parity place holders, main data place holders, which are related to data deinterleaving in a later process, as shown in FIG. 16A. Herein, the main data place holders are inserted because the enhanced data bytes and the main data bytes are alternately mixed with one another in regions SECOND and THIRD based upon the input of the data deinterleaver, as shown in FIG. 16A. For example, based upon the data outputted after data deinterleaving, the place holder for the MPEG header may be allocated at the very beginning of each packet.

Furthermore, the group formatter 1114 either inserts known data generated in accordance with a pre-determined method or inserts known data place holders for inserting the known data in a later process. Additionally, place holders for initializing the trellis encoder 1127 are also inserted in the corresponding regions. For example, the initialization data place holders may be inserted in the beginning of the known data sequence. Herein, the size of the enhanced data that can be inserted in a data group may vary in accordance with the sizes of the trellis initialization place holders or known data (or known data place holders), MPEG header place holders, and RS parity place holders.

The output of the group formatter 1114 is inputted to the data deinterleaver 1115. And, the data deinterleaver 1115 deinterleaves data by performing an inverse process of the data interleaves on the data and place holders within the data group, which are then outputted to the packet formatter 1116. More specifically, when the data and place holders within the data group configured, as shown in FIG. 16A, are deinterleaved by the data deinterleaver 1115, the data group being outputted to the packet formatter 1116 is configured to have the structure shown in FIG. 16B.

Among the data deinterleaved and inputted, the packet formatter 1116 removes the main data place holder and RS parity place holder that were allocated for the deinterleaving process from the inputted deinterleaved data. Thereafter, the remaining portion of the corresponding data is grouped, and 4 bytes of MPEG header are inserted therein. The 4-byte MPEG header is configured of a 1-byte MPEG synchronization byte added to the 3-byte MPEG header place holder.

When the group formatter 1114 inserts the known data place holder, the packet formatter 1116 may either insert actual known data in the known data place holder or output the known data place holder without any change or modification for a replacement insertion in a later process. Afterwards, the packet formatter 1116 divides the data within the above-described packet-formatted data group into 188-byte unit enhanced data packets (i.e., MPEG TS packets), which are then provided to the packet multiplexer 1121. The packet multiplexer 1121 multiplexes the 188-byte unit enhanced data packet and main data packet outputted from the packet formatter 1116 according to a pre-defined multiplexing method. Subsequently, the multiplexed data packets are outputted to the data randomizer 1122. The multiplexing method may be modified or altered in accordance with diverse variables of the system design.

As an example of the multiplexing method of the packet multiplexer 1121, the enhanced data burst section and the main data section may be identified along a time axis (or a chronological axis) and may be alternately repeated. At this point, the enhanced data burst section may transmit at least one data group, and the main data section may transmit only the main data. The enhanced data burst section may also transmit the main data. If the enhanced data are outputted in a burst structure, as described above, the receiving system receiving only the enhanced data may turn the power on only during the burst section so as to receive the enhanced data, and may turn the power off during the main data section in which main data are transmitted, so as to prevent the main data from being received, thereby reducing the power consumption of the receiving system.

When the data being inputted correspond to the main data packet, the data randomizer 1122 performs the same randomizing process of the conventional randomizer. More specifically, the MPEG synchronization byte included in the main data packet is discarded and a pseudo random byte generated from the remaining 187 bytes is used so as to randomize the data. Thereafter, the randomized data are outputted to the RS encoder/non-systematic RS encoder 1123. However, when the inputted data correspond to the enhanced data packet, the MPEG synchronization byte of the 4-byte MPEG header included in the enhanced data packet is discarded, and data randomizing is performed only on the remaining 3-byte MPEG header. Randomizing is not performed on the remaining portion of the enhanced data. Instead, the remaining portion of the enhanced data is outputted to the RS encoder/non-systematic RS encoder 1123. This is because the randomizing process has already been performed on the enhanced data by the enhanced data randomizer 1111 in an earlier process. Herein, a data randomizing process may or may not be performed on the known data (or known data place holder) and the initialization data place holder included in the enhanced data packet.

The RS encoder/non-systematic RS encoder 1123 RS-codes the data randomized by the data randomizer 1122 or the data bypassing the data randomizer 1122. Then, the RS encoder/non-systematic RS encoder 1123 adds a 20-byte RS parity to the coded data, thereby outputting the RS-parity-added data to the data interleaver 1124. At this point, if the inputted data correspond to the main data packet, the RS encoder/non-systematic RS encoder 1123 performs a systematic RS-coding process identical to that of the conventional receiving system on the inputted data, thereby adding the 20-byte RS parity at the end of the 187-byte data. Alternatively, if the inputted data correspond to the enhanced data packet, the 20 bytes of RS parity gained by performing the non-systematic RS-coding are respectively inserted in the decided parity byte places within the enhanced data packet. Herein, the data interleaver 1124 corresponds to a byte unit convolutional interleaver. The output of the data interleaver 1124 is inputted to the parity byte replacer 1125 and the non-systematic RS encoder 1126.

Meanwhile, a memory within the trellis encoding module 1127, which is positioned after the parity byte replacer 1125, should first be initialized in order to allow the output data of the trellis encoding module 1127 so as to become the known data defined based upon an agreement between the receiving system and the transmitting system. More specifically, the memory of the trellis encoding module 1127 should first be initialized before the known data sequence being inputted is trellis-encoded. At this point, the beginning of the known data sequence that is inputted corresponds to the initialization data place holder inserted by the group formatter 1114 and not the actual known data. Therefore, a process of generating initialization data right before the trellis-encoding of the known data sequence being inputted and a process of replacing the initialization data place holder of the corresponding trellis encoding module memory with the newly generated initialization data are required.

A value of the trellis memory initialization data is decided based upon the memory status of the trellis encoding module 1127, thereby generating the trellis memory initialization data accordingly. Due to the influence of the replace initialization data, a process of recalculating the RS parity, thereby replacing the RS parity outputted from the trellis encoding module 1127 with the newly calculated RS parity is required. Accordingly, the non-systematic RS encoder 1126 receives the enhanced data packet including the initialization data place holder that is to be replaced with the initialization data from the data interleaver 1124 and also receives the initialization data from the trellis encoding module 1127. Thereafter, among the received enhanced data packet, the initialization data place holder is replaced with the initialization data. Subsequently, the RS parity data added to the enhanced data packet are removed. Then, a new non-systematic RS parity is calculated and outputted to the parity byte replacer 1125.

Accordingly, the parity byte replacer 1125 selects the output of the data interleaver 1124 as the data within the enhanced data packet, and selects the output of the non-systematic RS encoder 1126 as the RS parity. Thereafter, the parity byte replacer 1125 outputs the selected data.

Meanwhile, if the main data packet is inputted, or if the enhanced data packet that does not include the initialization data place holder that is to be replaced, the parity byte replacer 1125 selects the data and RS parity outputted from the data interleaver 1124 and directly outputs the selected data to the trellis encoding module 1127 without modification. The trellis encoding module 1127 converts the byte-unit data to symbol-unit data and 12-way interleaves and trellis-encodes the converted data, which are then outputted to the frame multiplexer 1128. The frame multiplexer 1128 inserts field synchronization and segment synchronization signals in the output of the trellis encoding module 1127 and then outputs the processed data to the transmitting unit 1130. Herein, the transmitting unit 1130 includes a pilot inserter 1131, a modulator 1132, and a radio frequency (RF) up-converter 1133. The operation of the transmitting unit 1130 is identical to the conventional transmitters. Therefore, a detailed description of the same will be omitted for simplicity.

Figure 17:
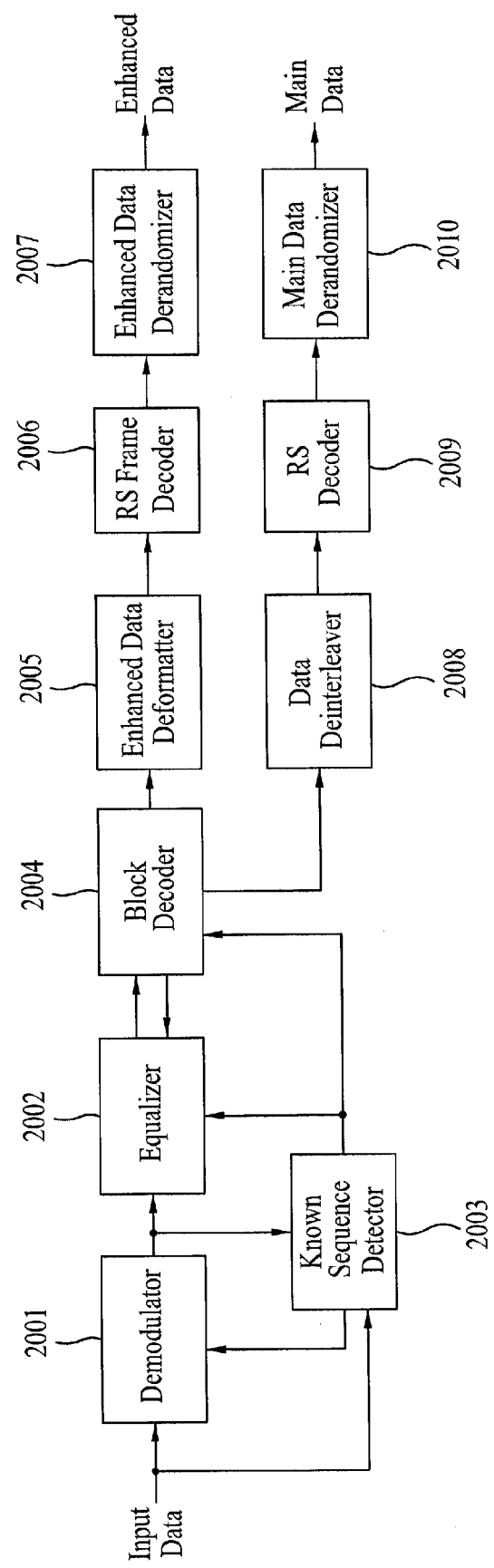
FIG. 17 illustrates a block diagram showing a general structure of a demodulating unit within a receiving system according to another embodiment of the present invention.

FIG. 17 illustrates a block diagram of a demodulating unit included in the receiving system according to another embodiment of the present invention. Herein, the demodulating unit may effectively process signals transmitted from the transmitting system shown in FIG. 15. Referring to FIG. 17, the demodulating unit includes a demodulator 2001, a channel equalizer 2002, a known sequence detector 2003, a block decoder 2004, an enhanced data deformatter 2005, a RS frame decoder 2006, an enhanced data derandomizer 2007, a data deinterleaver 2008, a RS decoder 2009, and a main data derandomizer 2010. More specifically, the enhanced data including known data and the main data are received through the tuner and inputted to the demodulator 2001 and the known sequence detector 2003. The demodulator 2001 performs automatic gain control, carrier wave recovery, and timing recovery on the data that are being inputted, thereby creating baseband data, which are then outputted to the equalizer 2002 and the known sequence detector 2003. The equalizer 2002 compensates the distortion within the channel included in the demodulated data. Then, the equalizer 2002 outputs the compensated data to the block decoder 2004.

At this point, the known sequence detector 2003 detects the known data place inserted by the transmitting system to the input/output data of the demodulator 2001 (i.e., data prior to demodulation or data after demodulation). Then, along with the position information, the known sequence detector 2003 outputs the symbol sequence of the known data generated from the corresponding position to the demodulator 2001 and the equalizer 2002. Additionally, the known sequence detector 2003 outputs information enabling the block decoder 2004 to identify the enhanced data being additionally encoded by the transmitting system and the main data that are not additionally encoded to the block decoder 2004. Furthermore, although the connection is not shown in FIG. 17, the information detected by the known sequence detector 2003 may be used in the overall receiving system and may also be used in the enhanced data formatter 2005 and the RS frame decoder 2006.

By using the known data symbol sequence when performing the timing recovery or carrier wave recovery, the demodulating performance of the demodulator 2001 may be enhanced. Similarly, by using the known data, the channel equalizing performance of the channel equalizer 2002 may be enhanced. Furthermore, by feeding-back the decoding result of the block decoder 2004 to the channel equalizer 2002, the channel equalizing performance may also be enhanced.

The channel equalizer 2002 may perform channel equalization by using a plurality of methods. An example of estimating a channel impulse response (CIR) so as to perform channel equalization will be given in the description of the present invention. Most particularly, an example of estimating the CIR in accordance with each region within the data group, which is hierarchically divided and transmitted from the transmitting system, and applying each CIR differently will also be described herein. Furthermore, by using the known data, the place and contents of which is known in accordance with an agreement between the transmitting system and the receiving system, and the field synchronization data, so as to estimate the CIR, the present invention may be able to perform channel equalization with more stability.

Herein, the data group that is inputted for the equalization process is divided into regions FIRST to THIRD, as shown in FIG. 16B. More specifically, in the example of the present invention, each region FIRST, SECOND, and THIRD are further divided into regions FI1 to FI5, regions SE1 and SE2, and regions TH1 to TH3, respectively. Referring to FIG. 16B, the CIR that is estimated from the field synchronization data in the data structure is referred to as CIR_FS. Alternatively, the CIRs that are estimated from each of the 5 known data sequences existing in region FIRST are sequentially referred to as CIR_N0, CIR_N1, CIR_N2, CIR_N3, and CIR_N4.

As described above, the present invention uses the CIR estimated from the field synchronization data and the known data sequences in order to perform channel equalization on data within the data group. At this point, each of the estimated CIRs may be directly used in accordance with the characteristics of each region within the data group. Alternatively, a plurality of the estimated CIRs may also be either interpolated or extrapolated so as to create a new CIR, which is then used for the channel equalization process.

Herein, when a value F(Q) of a function F(x) at a particular point Q and a value F(S) of the function F(x) at another particular point S are known, interpolation refers to estimating a function value of a point within the section between points Q and S. Linear interpolation corresponds to the simplest form among a wide range of interpolation operations. The linear interpolation described herein is merely exemplary among a wide range of possible interpolation methods. And, therefore, the present invention is not limited only to the examples set forth herein.

Alternatively, when a value F(Q) of a function F(x) at a particular point Q and a value F(S) of the function F(x) at another particular point S are known, extrapolation refers to estimating a function value of a point outside of the section between points Q and S. Linear extrapolation is the simplest form among a wide range of extrapolation operations. Similarly, the linear extrapolation described herein is merely exemplary among a wide range of possible extrapolation methods. And, therefore, the present invention is not limited only to the examples set forth herein.

More specifically, in case of region TH1, any one of the CIR_N4 estimated from a previous data group, the CIR_FS estimated from the current data group that is to be processed with channel equalization, and a new CIR generated by extrapolating the CIR_FS of the current data group and the CIR_N0 may be used to perform channel equalization. Alternatively, in case of region SE1, a variety of methods may be applied as described in the case for region TH1. For example, a new CIR created by linearly extrapolating the CIR_FS estimated from the current data group and the CIR_N0 may be used to perform channel equalization. Also, the CIR_FS estimated from the current data group may also be used to perform channel equalization. Finally, in case of region FI1, a new CIR may be created by interpolating the CIR_FS estimated from the current data group and CIR_N0, which is then used to perform channel equalization. Furthermore, any one of the CIR_FS estimated from the current data group and CIR_N0 may be used to perform channel equalization.

In case of regions FI2 to FI5, CIR_N(i−1) estimated from the current data group and CIR_N(i) may be interpolated to create a new CIR and use the newly created CIR to perform channel equalization. Also, any one of the CIR_N(i−1) estimated from the current data group and the CIR_N(i) may be used to perform channel equalization. Alternatively, in case of regions SE2, TH2, and TH3, CTR_N3 and CIR_N4 both estimated from the current data group may be extrapolated to create a new CIR, which is then used to perform the channel equalization process. Furthermore, the CIR_N4 estimated from the current data group may be used to perform the channel equalization process. Accordingly, an optimum performance may be obtained when performing channel equalization on the data inserted in the data group. The methods of obtaining the CIRs required for performing the channel equalization process in each region within the data group, as described above, are merely examples given to facilitate the understanding of the present invention. A wider range of methods may also be used herein. And, therefore, the present invention will not only be limited to the examples given in the description set forth herein.

Meanwhile, if the data being channel equalized and then inputted to the block decoder 2004 correspond to the enhanced data on which additional encoding and trellis encoding are both performed by the transmitting system, trellis-decoding and additional decoding processes are performed as inverse processes of the transmitting system. Alternatively, if the data being channel equalized and then inputted to the block decoder 2004 correspond to the main data on which additional encoding is not performed and only trellis-encoding is performed by the transmitting system, only the trellis-decoding process is performed. The data group decoded by the block decoder 2004 is inputted to the enhanced data deformatter 2005, and the main data packet is inputted to the data deinterleaver 2008.

More specifically, if the inputted data correspond to the main data, the block decoder 2004 performs Viterbi decoding on the inputted data, so as to either output a hard decision value or hard-decide a soft decision value and output the hard-decided result. On the other hand, if the inputted correspond to the enhanced data, the block decoder 2004 outputs either a hard decision value or a soft decision value on the inputted enhanced data. In other words, if the data inputted to the block decoder 2004 correspond to the enhanced data, the block decoder 2004 performs a decoding process on the data encoded by the block processor and the trellis encoder of the transmitting system. At this point, the output of the RS frame encoder included in the pre-processor of the transmitting system becomes an external code, and the output of the block processor and the trellis encoder becomes an internal code. In order to show maximum performance of the external code when decoding such connection codes, the decoder of the internal code should output a soft decision value. Therefore, the block decoder 2004 may output a hard decision value on the enhanced data. However, when required, it is more preferable that the block decoder 2004 outputs a soft decision value.

The present invention may also be used for configuring a reliability map using the soft decision value. The reliability map determines and indicates whether a byte corresponding to a group of 8 bits decided by the code of the soft decision value is reliable. For example, when an absolute value of the soft decision value exceeds a pre-determined threshold value, the value of the bit corresponding to the soft decision value code is determined to be reliable. However, if the absolute value does not exceed the pre-determined threshold value, then the value of the corresponding bit is determined to be not reliable. Further, if at least one bit among the group of 8 bits, which are determined based upon the soft decision value, is determined to be not reliable, then the reliability map indicates that the entire byte is not reliable. Herein, the process of determining the reliability by 1-bit units is merely exemplary. The corresponding byte may also be indicated to be not reliable if a plurality of bits (e.g., 4 bits) is determined to be not reliable.

Conversely, when all of the bits are determined to be reliable within one byte (i.e., when the absolute value of the soft value of all bits exceeds the pre-determined threshold value), then the reliability map determines and indicates that the corresponding data byte is reliable. Similarly, when more than 4 bits are determined to be reliable within one data byte, then the reliability map determines and indicates that the corresponding data byte is reliable. The estimated numbers are merely exemplary and do not limit the scope and spirit of the present invention. Herein, the reliability map may be used when performing error correction decoding processes.

Meanwhile, the data deinterleaver 2008, the RS decoder 2009, and the main data derandomizer 2010 are blocks required for receiving the main data. These blocks may not be required in a receiving system structure that receives only the enhanced data. The data deinterleaver 2008 performs an inverse process of the data interleaver of the transmitting system. More specifically, the data deinterleaver 2008 deinterleaves the main data being outputted from the block decoder 2004 and outputs the deinterleaved data to the RS decoder 2009. The RS decoder 2009 performs systematic RS decoding on the deinterleaved data and outputs the systematically decoded data to the main data derandomizer 2010. The main data derandomizer 2010 receives the data outputted from the RS decoder 2009 so as to generate the same pseudo random byte as that of the randomizer in the transmitting system. The main data derandomizer 2010 then performs a bitwise exclusive OR (XOR) operation on the generated pseudo random data byte, thereby inserting the MPEG synchronization bytes to the beginning of each packet so as to output the data in 188-byte main data packet units.

Herein, the format of the data being outputted to the enhanced data deformatter 2005 from the block decoder 2004 is a data group format. At this point, the enhanced data deformatter 2005 already knows the structure of the input data. Therefore, the enhanced data deformatter 2005 identifies the system information including signaling information and the enhanced data from the data group. Thereafter, the identified signaling information is transmitted to where the system information is required, and the enhanced data are outputted to the RS frame decoder 2006. The enhanced data deformatter 2005 removes the known data, trellis initialization data, and MPEG header that were included in the main data and the data group and also removes the RS parity that was added by the RS encoder/non-systematic RS encoder of the transmitting system. Thereafter, the processed data are outputted to the RS frame decoder 2006.

More specifically, the RS frame decoder 2006 receives the RS-coded and CRC-coded enhanced data from the enhanced data deformatter 2005 so as to configure the RS frame. The RS frame decoder 2006 performs an inverse process of the RS frame encoder included in the transmitting system, thereby correcting the errors within the RS frame. Then, the 1-byte MPEG synchronization byte, which was removed during the RS frame coding process, is added to the error corrected enhanced data packet. Subsequently, the processed data are outputted to the enhanced data derandomizer 2007. Herein, the enhanced data derandomizer 2007 performs a derandomizing process, which corresponds to an inverse process of the enhanced data randomizer included in the transmitting system, on the received enhanced data. Then, by outputting the processed data, the enhanced data transmitted from the transmitting system can be obtained.

According to an embodiment of the present invention, the RS frame decoder 2006 may also be configured as follows. The RS frame decoder 2006 may perform a CRC syndrome check on the RS frame, thereby verifying whether or not an error has occurred in each row. Subsequently, the CRC checksum is removed and the presence of an error is indicated on a CRC error flag corresponding to each row. Then, a RS decoding process is performed on the RS frame having the CRC checksum removed in a column direction. At this point, depending upon the number of CRC error flags, a RS erasure decoding process may be performed. More specifically, by checking the CRC error flags corresponding to each row within the RS frame, the number of CRC error flags may be determined whether it is greater or smaller than the maximum number of errors, when RS decoding the number of rows with errors (or erroneous rows) in the column direction. Herein, the maximum number of errors corresponds to the number of parity bytes inserted during the RS decoding process. As an example of the present invention, it is assumed that 48 parity bytes are added to each column.

If the number of rows with CRC errors is equal to or smaller than the maximum number of errors (e.g., 48), which may be corrected by the RS erasure decoding process, the RS erasure decoding process is performed on the RS frame in the column direction. Thereafter, the 48 bytes of parity data that were added at the end of each column are removed. However, if the number of rows with CRC errors is greater than the maximum number of errors (e.g., 48), which may be corrected by the RS erasure decoding process, the RS erasure decoding process cannot be performed. In this case, the error may be corrected by performing a general RS decoding process.

As another embodiment of the present invention, the error correction ability may be enhanced by using the reliability map created when configuring the RS frame from the soft decision value. More specifically, the RS frame decoder 2006 compares the absolute value of the soft decision value obtained from the block decoder 2004 to the pre-determined threshold value so as to determine the reliability of the bit values that are decided by the code of the corresponding soft decision value. Then, 8 bits are grouped to configure a byte. Then, the reliability information of the corresponding byte is indicated on the reliability map. Therefore, even if a specific row is determined to have CRC errors as a result of the CRC syndrome checking process of the corresponding row, it is not assumed that all of the data bytes included in the corresponding row have error. Instead, only the data bytes that are determined to be not reliable, after referring to the reliability information on the reliability map, are set to have errors. In other words, regardless of the presence of CRC errors in the corresponding row, only the data bytes that are determined to be not reliable (or unreliable) by the reliability map are set as erasure points.

Thereafter, if the number of erasure points for each column is equal to or smaller than the maximum number of errors (e.g., 48), the RS erasure decoding process is performed on the corresponding the column. Conversely, if the number of erasure points is greater than the maximum number of errors (e.g., 48), which may be corrected by the RS erasure decoding process, a general decoding process is performed on the corresponding column. In other words, if the number of rows having CRC errors is greater than the maximum number of errors (e.g., 48), which may be corrected by the RS erasure decoding process, either a RS erasure decoding process or a general RS decoding process is performed on a particular column in accordance with the number of erasure point within the corresponding column, wherein the number is decided based upon the reliability information on the reliability map. When the above-described process is performed, the error correction decoding process is performed in the direction of all of the columns included in the RS frame. Thereafter, the 48 bytes of parity data added to the end of each column are removed.

Figure 18:
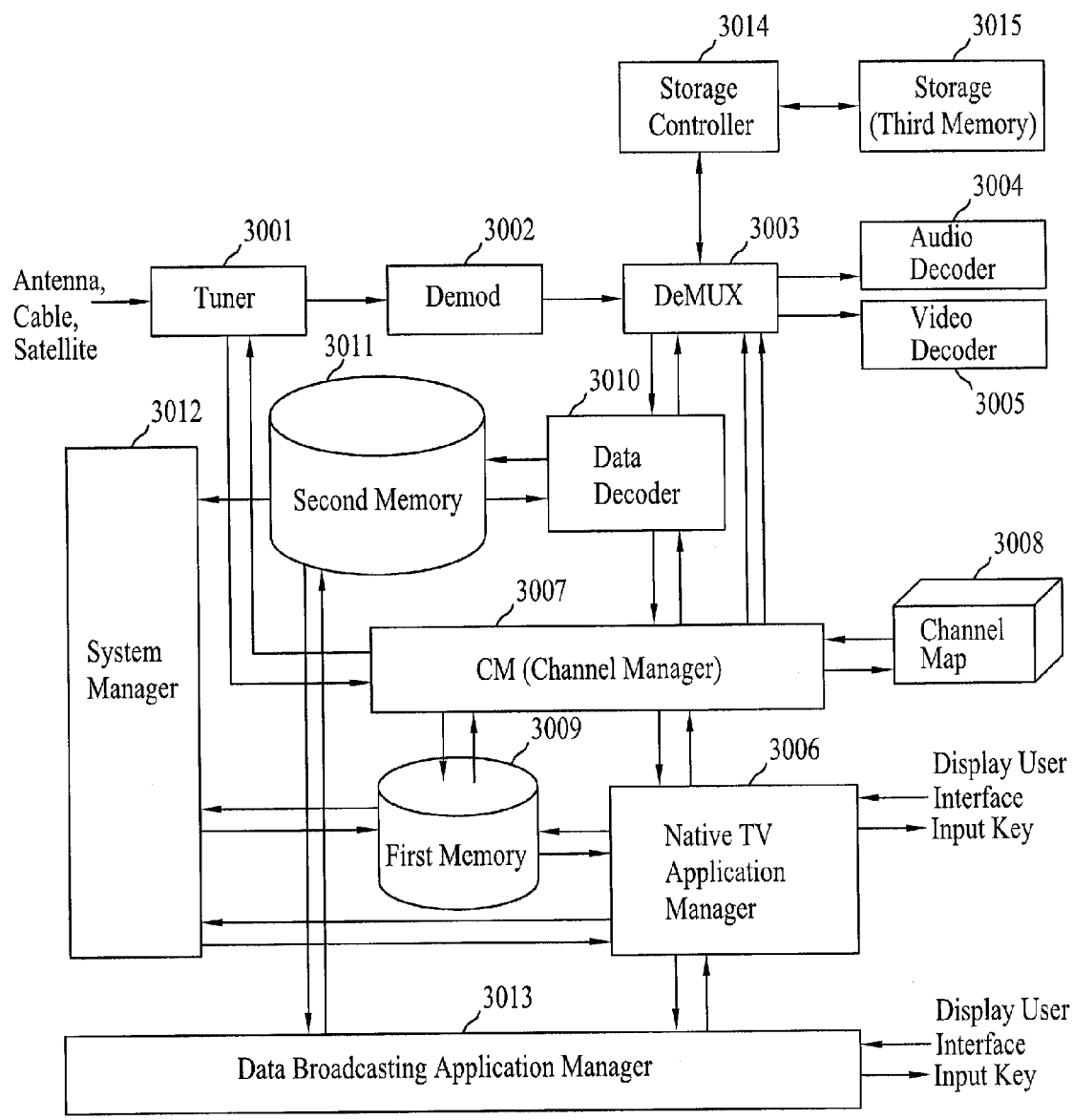
FIG. 18 illustrates a block diagram showing the structure of a receiving system according to an embodiment of the present invention.

FIG. 18 illustrates a block diagram showing the structure of a digital broadcast receiving system according to an embodiment of the present invention. Referring to FIG. 18, the digital broadcast receiving system includes a tuner 3001, a demodulating unit 3002, a demultiplexer 3003, an audio decoder 3004, a video decoder 3005, a native TV application manager 3006, a channel manager 3007, a channel map 3008, a first memory 3009, a data decoder 3010, a second memory 3011, a system manager 3012, a data broadcasting application manager 3013, a storage controller 3014, and a third memory 3015. Herein, the third memory 3015 is a mass storage device, such as a hard disk drive (HDD) or a memory chip. The tuner 3001 tunes a frequency of a specific channel through any one of an antenna, cable, and satellite. Then, the tuner 3001 down-converts the tuned frequency to an intermediate frequency (IF), which is then outputted to the demodulating unit 3002. At this point, the tuner 3001 is controlled by the channel manager 3007. Additionally, the result and strength of the broadcast signal of the tuned channel are also reported to the channel manager 3007. The data that are being received by the frequency of the tuned specific channel include main data, enhanced data, and table data for decoding the main data and enhanced data.

In the embodiment of the present invention, examples of the enhanced data may include data provided for data service, such as Java application data, HTML application data, XML data, and so on. The data provided for such data services may correspond either to a Java class file for the Java application, or to a directory file designating positions (or locations) of such files. Furthermore, such data may also correspond to an audio file and/or a video file used in each application. The data services may include weather forecast services, traffic information services, stock information services, services providing information quiz programs providing audience participation services, real time poll, user interactive education programs, gaming services, services providing information on soap opera (or TV series) synopsis, characters, original sound track, filing sites, services providing information on past sports matches, profiles and accomplishments of sports players, product information and product ordering services, services providing information on broadcast programs by media type, airing time, subject, and so on. The types of data services described above are only exemplary and are not limited only to the examples given herein. Furthermore, depending upon the embodiment of the present invention, the enhanced data may correspond to meta data. For example, the meta data use the XML application so as to be transmitted through a DSM-CC protocol.

The demodulating unit 3002 performs demodulation and channel equalization on the signal being outputted from the tuner 3001, thereby identifying the main data and the enhanced data. Thereafter, the identified main data and enhanced data are outputted in TS packet units. Examples of the demodulating unit 3002 are shown in FIG. 13 and FIG. 17. The demodulating unit shown in FIG. 13 and FIG. 17 is merely exemplary and the scope of the present invention is not limited to the examples set forth herein. In the embodiment given as an example of the present invention, only the enhanced data packet outputted from the demodulating unit 3002 is inputted to the demultiplexer 3003. In this case, the main data packet is inputted to another demultiplexer (not shown) that processes main data packets. Herein, the storage controller 3014 is also connected to the other demultiplexer in order to store the main data after processing the main data packets. The demultiplexer of the present invention may also be designed to process both enhanced data packets and main data packets in a single demultiplexer.

The storage controller 3014 is interfaced with the demultipelxer so as to control instant recording, reserved (or pre-programmed) recording, time shift, and so on of the enhanced data and/or main data. For example, when one of instant recording, reserved (or pre-programmed) recording, and time shift is set and programmed in the receiving system (or receiver) shown in FIG. 18, the corresponding enhanced data and/or main data that are inputted to the demultiplexer are stored in the third memory 3015 in accordance with the control of the storage controller 3014. The third memory 3015 may be described as a temporary storage area and/or a permanent storage area. Herein, the temporary storage area is used for the time shifting function, and the permanent storage area is used for a permanent storage of data according to the user's choice (or decision).

When the data stored in the third memory 3015 need to be reproduced (or played), the storage controller 3014 reads the corresponding data stored in the third memory 3015 and outputs the read data to the corresponding demultiplexer (e.g., the enhanced data are outputted to the demultiplexer 3003 shown in FIG. 18). At this point, according to the embodiment of the present invention, since the storage capacity of the third memory 3015 is limited, the compression encoded enhanced data and/or main data that are being inputted are directly stored in the third memory 3015 without any modification for the efficiency of the storage capacity. In this case, depending upon the reproduction (or reading) command, the data read from the third memory 3015 pass trough the demultiplexer so as to be inputted to the corresponding decoder, thereby being restored to the initial state.

The storage controller 3014 may control the reproduction (or play), fast-forward, rewind, slow motion, instant replay functions of the data that are already stored in the third memory 3015 or presently being buffered. Herein, the instant replay function corresponds to repeatedly viewing scenes that the viewer (or user) wishes to view once again. The instant replay function may be performed on stored data and also on data that are currently being received in real time by associating the instant replay function with the time shift function. If the data being inputted correspond to the analog format, for example, if the transmission mode is NTSC, PAL, and so on, the storage controller 3014 compression encodes the inputted data and stored the compression-encoded data to the third memory 3015. In order to do so, the storage controller 3014 may include an encoder, wherein the encoder may be embodied as one of software, middleware, and hardware. Herein, an MPEG encoder may be used as the encoder according to an embodiment of the present invention. The encoder may also be provided outside of the storage controller 3014.

Meanwhile, in order to prevent illegal duplication (or copies) of the input data being stored in the third memory 3015, the storage controller 3014 scrambles the input data and stores the scrambled data in the third memory 3015. Accordingly, the storage controller 3014 may include a scramble algorithm for scrambling the data stored in the third memory 3015 and a descramble algorithm for descrambling the data read from the third memory 3015. Herein, the definition of scramble includes encryption, and the definition of descramble includes decryption. The scramble method may include using an arbitrary key (e.g., control word) to modify a desired set of data, and also a method of mixing signals.

Meanwhile, the demultiplexer 3003 receives the real-time data outputted from the demodulating unit 3002 or the data read from the third memory 3015 and demultiplexes the received data. In the example given in the present invention, the demultiplexer 3003 performs demultiplexing on the enhanced data packet. Therefore, in the present invention, the receiving and processing of the enhanced data will be described in detail. It should also be noted that a detailed description of the processing of the main data will be omitted for simplicity starting from the description of the demultiplexer 3003 and the subsequent elements.

The demultiplexer 3003 demultiplexer enhanced data and program specific information/program and system information protocol (PSI/PSIP) tables from the enhanced data packet inputted in accordance with the control of the data decoder 3010. Thereafter, the demultiplexed enhanced data and PSI/PSIP tables are outputted to the data decoder 3010 in a section format. In order to extract the enhanced data from the channel through which enhanced data are transmitted and to decode the extracted enhanced data, system information is required. Such system information may also be referred to as service information. The system information may include channel information, event information, etc. In the embodiment of the present invention, the PSI/PSIP tables are applied as the system information. However, the present invention is not limited to the example set forth herein. More specifically, regardless of the name, any protocol transmitting system information in a table format may be applied in the present invention.

The PSI table is an MPEG-2 system standard defined for identifying the channels and the programs. The PSIP table is an advanced television systems committee (ATSC) standard that can identify the channels and the programs. The PSI table may include a program association table (PAT), a conditional access table (CAT), a program map table (PMT), and a network information table (NIT). Herein, the PAT corresponds to special information that is transmitted by a data packet having a PID of '0'. The PAT transmits PID information of the PMT and PID information of the NIT corresponding to each program. The CAT transmits information on a paid broadcast system used by the transmitting system. The PMT transmits PID information of a transport stream (TS) packet, in which program identification numbers and individual bit sequences of video and audio data configuring the corresponding program are transmitted, and the PID information, in which PCR is transmitted. The NIT transmits information of the actual transmission network.

The PSIP table may include a virtual channel table (VCT), a system time table (STT), a rating region table (RRT), an extended text table (ETT), a direct channel change table (DCCT), an event information table (EIT), and a master guide table (MGT). The VCT transmits information on virtual channels, such as channel information for selecting channels and information such as packet identification (PID) numbers for receiving the audio and/or video data. More specifically, when the VCT is parsed, the PID of the audio/video data of the broadcast program may be known. Herein, the corresponding audio/video data are transmitted within the channel along with the channel name and the channel number. The STT transmits information on the current data and timing information. The RRT transmits information on region and consultation organs for program ratings. The ETT transmits additional description of a specific channel and broadcast program. The EIT transmits information on virtual channel events (e.g., program title, program start time, etc.). The DCCT/DCCSCT transmits information associated with automatic (or direct) channel change. And, the MGT transmits the versions and PID information of the above-mentioned tables included in the PSIP.

Each of the above-described tables included in the PSI/PSIP is configured of a basic unit referred to as a "section" and a combination of one or more sections forms a table. For example, the VCT may be divided into 256 sections. Herein, one section may include a plurality of virtual channel information. However, a single set of virtual channel information is not divided into two or more sections. At this point, the receiving system may parse and decode the data for the data service that are transmitting by using only the tables included in the PSI, or only the tables included in the PSIP, or a combination of tables included in both the PSI and the PSIP. In order to parse and decode the data for the data service, at least one of the PAT and PMT included in the PSI, and the VCT included in the PSIP is required. For example, the PAT may include the system information for transmitting the data corresponding to the data service, and the PID of the PMT corresponding to the data service data (or program number). The PMT may include the PID of the TS packet used for transmitting the data service data. The VCT may include information on the virtual channel for transmitting the data service data, and the PID of the TS packet for transmitting the data service data.

Meanwhile, depending upon the embodiment of the present invention, a DVB-SI may be applied instead of the PSIP. The DVB-SI may include a network information table (NIT), a service description table (SDT), an event information table (EIT), and a time and data table (TDT). The DVB-SI may be used in combination with the above-described PSI. Herein, the NIT divides the services corresponding to particular network providers by specific groups. The NIT includes all tuning information that are used during the IRD set-up. The NIT may be used for informing or notifying any change in the tuning information. The SDT includes the service name and different parameters associated with each service corresponding to a particular MPEG multiplex. The EIT is used for transmitting information associated with all events occurring in the MPEG multiplex. The EIT includes information on the current transmission and also includes information selectively containing different transmission streams that may be received by the IRD. And, the TDT is used for updating the clock included in the IRD.

Furthermore, three selective SI tables (i.e., a bouquet associate table (BAT), a running status table (RST), and a stuffing table (ST)) may also be included. More specifically, the bouquet associate table (BAT) provides a service grouping method enabling the IRD to provide services to the viewers. Each specific service may belong to at least one 'bouquet' unit. A running status table (RST) section is used for promptly and instantly updating at least one event execution status. The execution status section is transmitted only once at the changing point of the event status. Other SI tables are generally transmitted several times. The stuffing table (ST) may be used for replacing or discarding a subsidiary table or the entire SI tables.

In the present invention, the enhanced data included in the payload within the TS packet consist of a digital storage media-command and control (DSM-CC) section format. However, the TS packet including the data service data may correspond either to a packetized elementary stream (PES) type or to a section type. More specifically, either the PES type data service data configure the TS packet, or the section type data service data configure the TS packet. The TS packet configured of the section type data will be given as the example of the present invention. At this point, the data service data are includes in the digital storage media-command and control (DSM-CC) section. Herein, the DSM-CC section is then configured of a 188-byte unit TS packet.

Furthermore, the packet identification of the TS packet configuring the DSM-CC section is included in a data service table (DST). When transmitting the DST, '0x95' is assigned as the value of a stream_type field included in the service location descriptor of the PMT or the VCT. More specifically, when the PMT or VCT stream_type field value is '0x95', the receiving system may acknowledge that data broadcasting including enhanced data (i.e., the enhanced data) is being received. At this point, the enhanced data may be transmitted by a data carousel method. The data carousel method corresponds to repeatedly transmitting identical data on a regular basis.

At this point, according to the control of the data decoder 3010, the demultiplexer 3003 performs section filtering, thereby discarding repetitive sections and outputting only the non-repetitive sections to the data decoder 3010. The demultiplexer 3003 may also output only the sections configuring desired tables (e.g., VCT) to the data decoder 3010 by section filtering. Herein, the VCT may include a specific descriptor for the enhanced data. However, the present invention does not exclude the possibilities of the enhanced data being included in other tables, such as the PMT. The section filtering method may include a method of verifying the PID of a table defined by the MGT, such as the VCT, prior to performing the section filtering process. Alternatively, the section filtering method may also include a method of directly performing the section filtering process without verifying the MGT, when the VCT includes a fixed PID (i.e., a base PID). At this point, the demultiplexer 3003 performs the section filtering process by referring to a table_id field, a version_number field, a section_number field, etc.

As described above, the method of defining the PID of the VCT broadly includes two different methods. Herein, the PID of the VCT is a packet identifier required for identifying the VCT from other tables. The first method consists of setting the PID of the VCT so that it is dependent to the MGT. In this case, the receiving system cannot directly verify the VCT among the many PSI and/or PSIP tables. Instead, the receiving system must check the PID defined in the MGT in order to read the VCT. Herein, the MGT defines the PID, size, version number, and so on, of diverse tables. The second method consists of setting the PID of the VCT so that the PID is given a base PID value (or a fixed PID value), thereby being independent from the MGT. In this case, unlike in the first method, the VCT according to the present invention may be identified without having to verify every single PID included in the MGT. Evidently, an agreement on the base PID must be previously made between the transmitting system and the receiving system.

Meanwhile, in the embodiment of the present invention, the demultiplexer 3003 may output only an application information table (AIT) to the data decoder 3010 by section filtering. The AIT includes information on an application being operated in the receiving system for the data service. The AIT may also be referred to as an XAIT, and an AMT. Therefore, any table including application information may correspond to the following description. When the AIT is transmitted, a value of '0x05 ' may be assigned to a stream_type field of the PMT. The AIT may include application information, such as application name, application version, application priority, application ID, application status (i.e., auto-start, user-specific settings, kill, etc.), application type (i.e., Java or HTML), position (or location) of stream including application class and data files, application platform directory, and location of application icon.

In the method for detecting application information for the data service by using the AIT, component_tag, original_network_id, transport_stream_id, and service_id fields may be used for detecting the application information. The component_tag field designates an elementary stream carrying a DSI of a corresponding object carousel. The original_network_id field indicates a DVB-SI original_network_id of the TS providing transport connection. The transport_stream_id field indicates the MPEG TS of the TS providing transport connection, and the service_id field indicates the DVB-SI of the service providing transport connection. Information on a specific channel may be obtained by using the original field, original_the transport_stream_id field, and the service_id field. The data service data, such as the application data, detected by using the above-described method may be stored in the second memory 3011 by the data decoder 3010.

The data decoder 3010 parses the DSM-CC section configuring the demultiplexed enhanced data. Then, the enhanced data corresponding to the parsed result are stored as a database in the second memory 3011. The data decoder 3010 groups a plurality of sections having the same table identification (table_id) so as to configure a table, which is then parsed. Thereafter, the parsed result is stored as a database in the second memory 3011. At this point, by parsing data and/or sections, the data decoder 3010 reads all of the remaining actual section data that are not section-filtered by the demultiplexer 3003. Then, the data decoder 3010 stores the read data to the second memory 3011. The second memory 3011 corresponds to a table and data carousel database storing system information parsed from tables and enhanced data parsed from the DSM-CC section. Herein, a table_id field, a section_number field, and a last_section_number field included in the table may be used to indicate whether the corresponding table is configured of a single section or a plurality of sections. For example, TS packets having the PID of the VCT are grouped to form a section, and sections having table identifiers allocated to the VCT are grouped to form the VCT.

When the VCT is parsed, information on the virtual channel to which enhanced data are transmitted may be obtained. The obtained application identification information, service component identification information, and service information corresponding to the data service may either be stored in the second memory 3011 or be outputted to the data broadcasting application manager 3013. In addition, reference may be made to the application identification information, service component identification information, and service information in order to decode the data service data. Alternatively, such information may also prepare the operation of the application program for the data service. Furthermore, the data decoder 3010 controls the demultiplexing of the system information table, which corresponds to the information table associated with the channel and events. Thereafter, an A.V PID list may be transmitted to the channel manager 3007.

The channel manager 3007 may refer to the channel map 3008 in order to transmit a request for receiving system-related information data to the data decoder 3010, thereby receiving the corresponding result. In addition, the channel manager 3007 may also control the channel tuning of the tuner 3001. Furthermore, the channel manager 3007 may directly control the demultiplexer 3003, so as to set up the A/V PID, thereby controlling the audio decoder 3004 and the video decoder 3005. The audio decoder 3004 and the video decoder 3005 may respectively decode and output the audio data and video data demultiplexed from the main data packet. Alternatively, the audio decoder 3004 and the video decoder 3005 may respectively decode and output the audio data and video data demultiplexed from the enhanced data packet. Meanwhile, when the enhanced data include data service data, and also audio data and video data, it is apparent that the audio data and video data demultiplexed by the demultiplexer 3003 are respectively decoded by the audio decoder 3004 and the video decoder 3005. For example, an audio-coding (AC)-3 decoding algorithm may be applied to the audio decoder 3004, and a MPEG-2 decoding algorithm may be applied to the video decoder 3005.

Meanwhile, the native TV application manager 3006 operates a native application program stored in the first memory 3009, thereby performing general functions such as channel change. The native application program refers to software stored in the receiving system upon shipping of the product. More specifically, when a user request (or command) is transmitted to the receiving system through a user interface (UI), the native TV application manger 3006 displays the user request on a screen through a graphic user interface (GUI), thereby responding to the user's request. The user interface receives the user request through an input device, such as a remote controller, a key pad, a jog controller, an a touchscreen provided on the screen, and then outputs the received user request to the native TV application manager 3006 and the data broadcasting application manager 3013. Furthermore, the native TV application manager 3006 controls the channel manager 3007, thereby controlling channel-associated, such as the management of the channel map 3008, and controlling the data decoder 3010. The native TV application manager 3006 also controls the GUI of the overall receiving system, thereby storing the user request and status of the receiving system in the first memory 3009 and restoring the stored information.

The channel manager 3007 controls the tuner 3001 and the data decoder 3010, so as to managing the channel map 3008 so that it can respond to the channel request made by the user. More specifically, channel manager 3007 sends a request to the data decoder 3010 so that the tables associated with the channels that are to be tuned are parsed. The results of the parsed tables are reported to the channel manager 3007 by the data decoder 3010. Thereafter, based on the parsed results, the channel manager 3007 updates the channel map 3008 and sets up a PID in the demultiplexer 3003 for demultiplexing the tables associated with the data service data from the enhanced data.

The system manager 3012 controls the booting of the receiving system by turning the power on or off. Then, the system manager 3012 stores ROM images (including downloaded software images) in the first memory 3009. More specifically, the first memory 3009 stores management programs such as operating system (OS) programs required for managing the receiving system and also application program executing data service functions. The application program is a program processing the data service data stored in the second memory 3011 so as to provide the user with the data service. If the data service data are stored in the second memory 3011, the corresponding data service data are processed by the above-described application program or by other application programs, thereby being provided to the user. The management program and application program stored in the first memory 3009 may be updated or corrected to a newly downloaded program. Furthermore, the storage of the stored management program and application program is maintained without being deleted even if the power of the system is shut down. Therefore, when the power is supplied the programs may be executed without having to be newly downloaded once again.

The application program for providing data service according to the present invention may either be initially stored in the first memory 3009 upon the shipping of the receiving system, or be stored in the first 3009 after being downloaded. The application program for the data service (i.e., the data service providing application program) stored in the first memory 3009 may also be deleted, updated, and corrected. Furthermore, the data service providing application program may be downloaded and executed along with the data service data each time the data service data are being received.

When a data service request is transmitted through the user interface, the data broadcasting application manager 3013 operates the corresponding application program stored in the first memory 3009 so as to process the requested data, thereby providing the user with the requested data service. And, in order to provide such data service, the data broadcasting application manager 3013 supports the graphic user interface (GUT). Herein, the data service may be provided in the form of text (or short message service (SMS)), voice message, still image, and moving image. The data broadcasting application manager 3013 may be provided with a platform for executing the application program stored in the first memory 3009. The platform may be, for example, a Java virtual machine for executing the Java program. Hereinafter, an example of the data broadcasting application manager 3013 executing the data service providing application program stored in the first memory 3009, so as to process the data service data stored in the second memory 3011, thereby providing the user with the corresponding data service will now be described in detail.

Assuming that the data service corresponds to a traffic information service, the data service according to the present invention is provided to the user of a receiving system that is not equipped with an electronic map and/or a GPS system in the form of at least one of a text (or short message service (SMS)), a voice message, a graphic message, a still image, and a moving image. In this case, is a GPS module is mounted on the receiving system shown in FIG. 18, the GPS module receives satellite signals transmitted from a plurality of low earth orbit satellites and extracts the current position (or location) information (e.g., longitude, latitude, altitude), thereby outputting the extracted information to the data broadcasting application manager 3013.

At this point, it is assumed that the electronic map including information on each link and nod and other diverse graphic information are stored in one of the second memory 3011, the first memory 3009, and another memory that is not shown. More specifically, according to the request made by the data broadcasting application manager 3013, the data service data stored in the second memory 3011 are read and inputted to the data broadcasting application manager 3013. The data broadcasting application manager 3013 translates (or deciphers) the data service data read from the second memory 3011, thereby extracting the necessary information according to the contents of the message and/or a control signal.

Figure 19:
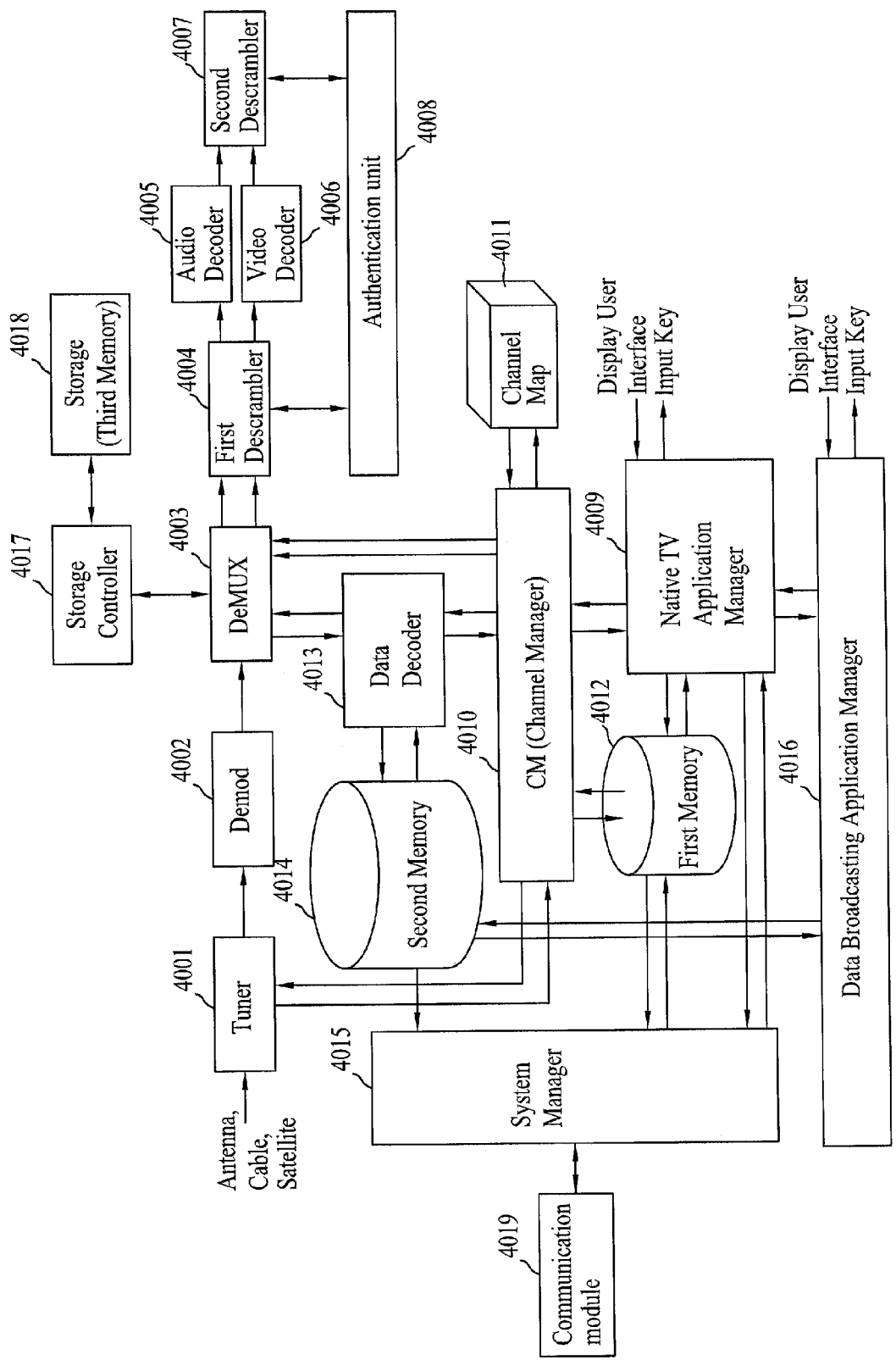
FIG. 19 illustrates a block diagram showing the structure of a receiving system according to another embodiment of the present invention.

FIG. 19 illustrates a block diagram showing the structure of a digital broadcast (or television) receiving system according to another embodiment of the present invention. Referring to FIG. 19, the digital broadcast receiving system includes a tuner 4001, a demodulating unit 4002, a demultiplexer 4003, a first descrambler 4004, an audio decoder 4005, a video decoder 4006, a second descrambler 4007, an authentication unit 4008, a native TV application manager 4009, a channel manager 4010, a channel map 4011, a first memory 4012, a data decoder 4013, a second memory 4014, a system manager 4015, a data broadcasting application manager 4016, a storage controller 4017, a third memory 4018, and a telecommunication module 4019. Herein, the third memory 4018 is a mass storage device, such as a hard disk drive (HDD) or a memory chip. Also, during the description of the digital broadcast (or television or DTV) receiving system shown in FIG. 19, the components that are identical to those of the digital broadcast receiving system of FIG. 18 will be omitted for simplicity.

As described above, in order to provide services for preventing illegal duplication (or copies) or illegal viewing of the enhanced data and/or main data that are transmitted by using a broadcast network, and to provide paid broadcast services, the transmitting system may generally scramble and transmit the broadcast contents. Therefore, the receiving system needs to descramble the scrambled broadcast contents in order to provide the user with the proper broadcast contents. Furthermore, the receiving system may generally be processed with an authentication process with an anuthnetication means before the descrambling process. Hereinafter, the receiving system including an authentication means and a descrambling means according to an embodiment of the present invention will now be described in detail.

According to the present invention, the receiving system may be provided with a descrambling means receiving scrambled broadcasting contents and an authentication means authenticating (or verifying) whether the receiving system is entitled to receive the descrambled contents. Hereinafter, the descrambling means will be referred to as first and second descramblers 4004 and 4007, and the authentication means will be referred to as an authentication unit 4008. Such naming of the corresponding components is merely exemplary and is not limited to the terms suggested in the description of the present invention. For example, the units may also be referred to as a decryptor. Although FIG. 19 illustrates an example of the descramblers 4004 and 4007 and the authentication unit 4008 being provided inside the receiving system, each of the descramblers 4004 and 4007 and the authentication unit 4008 may also be separately provided in an internal or external module. Herein, the module may include a slot type, such as a SD or CF memory, a memory stick type, a USB type, and so on, and may be detachably fixed to the receiving system.

As described above, when the authentication process is performed successfully by the authentication unit 4008, the scrambled broadcasting contents are descrambled by the descramblers 4004 and 4007, thereby being provided to the user. At this point, a variety of the authentication method and descrambling method may be used herein. However, an agreement on each corresponding method should be made between the receiving system and the transmitting system. Hereinafter, the authentication and descrambling methods will now be described, and the description of identical components or process steps will be omitted for simplicity.

The receiving system including the authentication unit 4008 and the descramblers 4004 and 4007 will now be described in detail. The receiving system receives the scrambled broadcasting contents through the tuner 4001 and the demodulating unit 4002. Then, the system manager 4015 decides whether the received broadcasting contents have been scrambled. Herein, the demodulating unit 4002 may be included as a demodulating means according to embodiments of the present invention as described in FIG. 13 and FIG. 17. However, the present invention is not limited to the examples given in the description set forth herein. If the system manager 4015 decides that the received broadcasting contents have been scrambled, then the system manager 4015 controls the system to operate the authentication unit 4008. As described above, the authentication unit 4008 performs an authentication process in order to decide whether the receiving system according to the present invention corresponds to a legitimate host entitled to receive the paid broadcasting service. Herein, the authentication process may vary in accordance with the authentication methods.

For example, the authentication unit 4008 may perform the authentication process by comparing an IP address of an IP datagram within the received broadcasting contents with a specific address of a corresponding host. At this point, the specific address of the corresponding receiving system (or host) may be a MAC address. More specifically, the authentication unit 4008 may extract the IP address from the decapsulated IP datagram, thereby obtaining the receiving system information that is mapped with the IP address. At this point, the receiving system should be provided, in advance, with information (e.g., a table format) that can map the IP address and the receiving system information. Accordingly, the authentication unit 4008 performs the authentication process by determining the conformity between the address of the corresponding receiving system and the system information of the receiving system that is mapped with the IP address. In other words, if the authentication unit 4008 determines that the two types of information conform to one another, then the authentication unit 4008 determines that the receiving system is entitled to receive the corresponding broadcasting contents.

In another example, standardized identification information is defined in advance by the receiving system and the transmitting system. Then, the identification information of the receiving system requesting the paid broadcasting service is transmitted by the transmitting system. Thereafter, the receiving system determines whether the received identification information conforms with its own unique identification number, so as to perform the authentication process. More specifically, the transmitting system creates a database for storing the identification information (or number) of the receiving system requesting the paid broadcasting service. Then, if the corresponding broadcasting contents are scrambled, the transmitting system includes the identification information in the EMM, which is then transmitted to the receiving system.

If the corresponding broadcasting contents are scrambled, messages (e.g., entitlement control message (ECM), entitlement management message (EMM)), such as the CAS information, mode information, message position information, that are applied to the scrambling of the broadcasting contents are transmitted through a corresponding data header or another data packet. The ECM may include a control word (CW) used for scrambling the broadcasting contents. At this point, the control word may be encoded with an authentication key. The EMM may include an authentication key and entitlement information of the corresponding data. Herein, the authentication key may be encoded with a receiving system-specific distribution key. In other words, assuming that the enhanced data are scrambled by using the control word, and that the authentication information and the descrambling information are transmitted from the transmitting system, the transmitting system encodes the CW with the authentication key and, then, includes the encoded CW in the entitlement control message (ECM), which is then transmitted to the receiving system. Furthermore, the transmitting system includes the authentication key used for encoding the CW and the entitlement to receive data (or services) of the receiving system (i.e., a standardized serial number of the receiving system that is entitled to receive the corresponding broadcasting service or data) in the entitlement management message (EMM), which is then transmitted to the receiving system.

Accordingly, the authentication unit 4008 of the receiving system extracts the identification information of the receiving system and the identification information included in the EMM of the broadcasting service that is being received. Then, the authentication unit 4008 determines whether the identification information conform to each other, so as to perform the authentication process. More specifically, if the authentication unit 4008 determines that the information conform to each other, then the authentication unit 4008 eventually determines that the receiving system is entitled to receive the request broadcasting service.

In yet another example, the authentication unit 4008 of the receiving system may be detachably fixed to an external module. In this case, the receiving system is interfaced with the external module through a common interface (CI). In other words, the external module may receive the data scrambled by the receiving system through the common interface, thereby performing the descrambling process of the received data. Alternatively, the external module may also transmit only the information required for the descrambling process to the receiving system. The common interface is configured on a physical layer and at least one protocol layer. Herein, in consideration of any possible expansion of the protocol layer in a later process, the corresponding protocol layer may be configured to have at least one layer that can each provide an independent function.

The external module may either consist of a memory or card having information on the key used for the scrambling process and other authentication information but not including any descrambling function, or consist of a card having the above-mentioned key information and authentication information and including the descrambling function. Both the receiving system and the external module should be authenticated in order to provide the user with the paid broadcasting service provided (or transmitted) from the transmitting system. Therefore, the transmitting system can only provide the corresponding paid broadcasting service to the authenticated pair of receiving system and external module.

Additionally, an authentication process should also be performed between the receiving system and the external module through the common interface. More specifically, the module may communicate with the system manager 4015 included in the receiving system through the common interface, thereby authenticating the receiving system. Alternatively, the receiving system may authenticate the module through the common interface. Furthermore, during the authentication process, the module may extract the unique ID of the receiving system and its own unique ID and transmit the extracted IDs to the transmitting system. Thus, the transmitting system may use the transmitted ID values as information determining whether to start the requested service or as payment information. Whenever necessary, the system manager 4015 transmits the payment information to the remote transmitting system through the telecommunication module 4019.

The authentication unit 4008 authenticates the corresponding receiving system and/or the external module. Then, if the authentication process is successfully completed, the authentication unit 4008 certifies the corresponding receiving system and/or the external module as a legitimate system and/or module entitled to receive the requested paid broadcasting service. In addition, the authentication unit 4008 may also receive authentication-associated information from a mobile telecommunications service provider to which the user of the receiving system is subscribed, instead of the transmitting system providing the requested broadcasting service. In this case, the authentication-association information may either be scrambled by the transmitting system providing the broadcasting service and, then, transmitted to the user through the mobile telecommunications service provider, or be directly scrambled and transmitted by the mobile telecommunications service provider. Once the authentication process is successfully completed by the authentication unit 4008, the receiving system may descramble the scrambled broadcasting contents received from the transmitting system. At this point, the descrambling process is performed by the first and second descramblers 4004 and 4007. Herein, the first and second descramblers 4004 and 4007 may be included in an internal module or an external module of the receiving system.

The receiving system is also provided with a common interface for communicating with the external module including the first and second descramblers 4004 and 4007, so as to perform the descrambling process. More specifically, the first and second descramblers 4004 and 4007 may be included in the module or in the receiving system in the form of hardware, middleware or software. Herein, the descramblers 4004 and 4007 may be included in any one of or both of the module and the receiving system. If the first and second descramblers 4004 and 4007 are provided inside the receiving system, it is advantageous to have the transmitting system (i.e., at least any one of a service provider and a broadcast station) scramble the corresponding data using the same scrambling method.

Alternatively, if the first and second descramblers 4004 and 4007 are provided in the external module, it is advantageous to have each transmitting system scramble the corresponding data using different scrambling methods. In this case, the receiving system is not required to be provided with the descrambling algorithm corresponding to each transmitting system. Therefore, the structure and size of receiving system may be simplified and more compact. Accordingly, in this case, the external module itself may be able to provide CA functions, which are uniquely and only provided by each transmitting systems, and functions related to each service that is to be provided to the user. The common interface enables the various external modules and the system manager 4015, which is included in the receiving system, to communicate with one another by a single communication method. Furthermore, since the receiving system may be operated by being connected with at least one or more modules providing different services, the receiving system may be connected to a plurality of modules and controllers.

In order to maintain successful communication between the receiving system and the external module, the common interface protocol includes a function of periodically checking the status of the opposite correspondent. By using this function, the receiving system and the external module is capable of managing the status of each opposite correspondent. This function also reports the user or the transmitting system of any malfunction that may occur in any one of the receiving system and the external module and attempts the recovery of the malfunction.

In yet another example, the authentication process may be performed through software. More specifically, when a memory card having CAS software downloaded, for example, and stored therein in advanced is inserted in the receiving system, the receiving system receives and loads the CAS software from the memory card so as to perform the authentication process. In this example, the CAS software is read out from the memory card and stored in the first memory 4012 of the receiving system. Thereafter, the CAS software is operated in the receiving system as an application program. According to an embodiment of the present invention, the CAS software is mounted on (or stored) in a middleware platform and, then executed. A Java middleware will be given as an example of the middleware included in the present invention. Herein, the CAS software should at least include information required for the authentication process and also information required for the descrambling process.

Therefore, the authentication unit 4008 performs authentication processes between the transmitting system and the receiving system and also between the receiving system and the memory card. At this point, as described above, the memory card should be entitled to receive the corresponding data and should include information on a normal receiving system that can be authenticated. For example, information on the receiving system may include a unique number, such as a standardized serial number of the corresponding receiving system. Accordingly, the authentication unit 4008 compares the standardized serial number included in the memory card with the unique information of the receiving system, thereby performing the authentication process between the receiving system and the memory card.

If the CAS software is first executed in the Java middleware base, then the authentication between the receiving system and the memory card is performed. For example, when the unique number of the receiving system stored in the memory card conforms to the unique number of the receiving system read from the system manager 4015, then the memory card is verified and determined to be a normal memory card that may be used in the receiving system. At this point, the CAS software may either be installed in the first memory 4012 upon the shipping of the present invention, or be downloaded to the first memory 4012 from the transmitting system or the module or memory card, as described above. Herein, the descrambling function may be operated by the data broadcasting application manger 4016 as an application program.

Thereafter, the CAS software parses the EMM/ECM packets outputted from the demultiplexer 4003, so as to verify whether the receiving system is entitled to receive the corresponding data, thereby obtaining the information required for descrambling (i.e., the CW) and providing the obtained CW to the descramblers 4004 and 4007. More specifically, the CAS software operating in the Java middleware platform first reads out the unique (or serial) number of the receiving system from the corresponding receiving system and compares it with the unique number of the receiving system transmitted through the EMM, thereby verifying whether the receiving system is entitled to receive the corresponding data. Once the receiving entitlement of the receiving system is verified, the corresponding broadcasting service information transmitted to the ECM and the entitlement of receiving the corresponding broadcasting service are used to verify whether the receiving system is entitled to receive the corresponding broadcasting service. Once the receiving system is verified to be entitled to receive the corresponding broadcasting service, the authentication key transmitted to the EMM is used to decode (or decipher) the encoded CW, which is transmitted to the ECM, thereby transmitting the decoded CW to the descramblers 4004 and 4007. Each of the descramblers 4004 and 4007 uses the CW to descramble the broadcasting service.

Meanwhile, the CAS software stored in the memory card may be expanded in accordance with the paid service which the broadcast station is to provide. Additionally, the CAS software may also include other additional information other than the information associated with the authentication and descrambling. Furthermore, the receiving system may download the CAS software from the transmitting system so as to upgrade (or update) the CAS software originally stored in the memory card. As described above, regardless of the type of broadcast receiving system, as long as an external memory interface is provided, the present invention may embody a CAS system that can meet the requirements of all types of memory card that may be detachably fixed to the receiving system. Thus, the present invention may realize maximum performance of the receiving system with minimum fabrication cost, wherein the receiving system may receive paid broadcasting contents such as broadcast programs, thereby acknowledging and regarding the variety of the receiving system. Moreover, since only the minimum application program interface is required to be embodied in the embodiment of the present invention, the fabrication cost may be minimized, thereby eliminating the manufacturer's dependence on CAS manufacturers. Accordingly, fabrication costs of CAS equipments and management systems may also be minimized.

Meanwhile, the descramblers 4004 and 4007 may be included in the module either in the form of hardware or in the form of software. In this case, the scrambled data that being received are descrambled by the module and then demodulated. Also, if the scrambled data that are being received are stored in the third memory 4018, the received data may be descrambled and then stored, or stored in the memory at the point of being received and then descrambled later on prior to being played (or reproduced). Thereafter, in case scramble/descramble algorithms are provided in the storage controller 4017, the storage controller 4017 scrambles the data that are being received once again and then stores the re-scrambled data to the third memory 4018.

In yet another example, the descrambled broadcasting contents (transmission of which being restricted) are transmitted through the broadcasting network. Also, information associated with the authentication and descrambling of data in order to disable the receiving restrictions of the corresponding data are transmitted and/or received through the telecommunications module 4019. Thus, the receiving system is able to perform reciprocal (or two-way) communication. The receiving system may either transmit data to the telecommunication module within the transmitting system or be provided with the data from the telecommunication module within the transmitting system. Herein, the data correspond to broadcasting data that are desired to be transmitted to or from the transmitting system, and also unique information (i.e., identification information) such as a serial number of the receiving system or MAC address.

The telecommunication module 4019 included in the receiving system provides a protocol required for performing reciprocal (or two-way) communication between the receiving system, which does not support the reciprocal communication function, and the telecommunication module included in the transmitting system. Furthermore, the receiving system configures a protocol data unit (PDU) using a tag-length-value (TLV) coding method including the data that are to be transmitted and the unique information (or ID information). Herein, the tag field includes indexing of the corresponding PDU. The length field includes the length of the value field. And, the value field includes the actual data that are to be transmitted and the unique number (e.g., identification number) of the receiving system.

The receiving system may configure a platform that is equipped with the Java platform and that is operated after downloading the Java application of the transmitting system to the receiving system through the network. In this case, a structure of downloading the PDU including the tag field arbitrarily defined by the transmitting system from a storage means included in the receiving system and then transmitting the downloaded PDU to the telecommunication module 4019 may also be configured. Also, the PDU may be configured in the Java application of the receiving system and then outputted to the telecommunication module 4019. The PDU may also be configured by transmitting the tag value, the actual data that are to be transmitted, the unique information of the corresponding receiving system from the Java application and by performing the TLV coding process in the receiving system. This structure is advantageous in that the firmware of the receiving system is not required to be changed even if the data (or application) desired by the transmitting system is added.

The telecommunication module within the transmitting system either transmits the PDU received from the receiving system through a wireless data network or configures the data received through the network into a PDU which is transmitted to the host. At this point, when configuring the PDU that is to be transmitted to the host, the telecommunication module within the transmitting end may include unique information (e.g., IP address) of the transmitting system which is located in a remote location. Additionally, in receiving and transmitting data through the wireless data network, the receiving system may be provided with a common interface, and also provided with a WAP, CDMA 1x EV-DO, which can be connected through a mobile telecommunication base station, such as CDMA and GSM, and also provided with a wireless LAN, mobile Internet, WiEro, WiMax, which can be connected through an access point. The above-described receiving system corresponds to the system that is not equipped with a telecommunication function. However, a receiving system equipped with telecommunication function does not require the telecommunication module 4019.

The broadcasting data being transmitted and received through the above-described wireless data network may include data required for performing the function of limiting data reception. Meanwhile, the demultiplexer 4003 receives either the real-time data outputted from the demodulating unit 4002 or the data read from the third memory 4018, thereby performing demultiplexing. In this embodiment of the present invention, the demultiplexer 4003 performs demultiplexing on the enhanced data packet. Similar process steps have already been described earlier in the description of the present invention. Therefore, a detailed of the process of demultiplexing the enhanced data will be omitted for simplicity.

The first descrambler 4004 receives the demultiplexed signals from the demultiplexer 4003 and then descrambles the received signals. At this point, the first descrambler 4004 may receive the authentication result received from the authentication unit 4008 and other data required for the descrambling process, so as to perform the descrambling process. The audio decoder 4005 and the video decoder 400G receive the signals descrambled by the first descrambler 4004, which are then decoded and outputted. Alternatively, if the first descrambler 4004 did not perform the descrambling process, then the audio decoder 4005 and the video decoder 4006 directly decode and output the received signals. In this case, the decoded signals are received and then descrambled by the second descrambler 4007 and processed accordingly.

As described above, the digital television (DTV) transmitting system and receiving system and method processing broadcast signal according to the present invention have advantages in that errors rarely occur when enhanced data is transmitted through channels and they also are compatible with the conventional receivers. Also, the present invention can receive enhanced data without errors through channels in which ghost images and noise are a serious problem, compared with the conventional system.

Also, in order to group a plurality of enhanced data packets having information, multiplex the group with main data, and transmit them, the present invention stratifies the group to form a plurality of regions, and classifies types of inserted data, and processing methods, etc., according to characteristics of stratified regions. Therefore, receiving performance of a receiving system can be enhanced. Especially, as pre-processes are performed differently according to types of data inserted to the stratified regions in the group and types of inputted enhanced data, receiving performance of a receiving system can be further enhanced.

Also, as recurrence turbo decoding for the enhanced data is performed in the receiving end, decoding performance of the receiving system can be increased.

In addition, the present invention is more effective when it is applied to portable and mobile receivers whose channels vary significantly. Also, the present invention clearly shows its effect in receivers which require resistance to noise.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A digital television (DTV) transmitter comprising:
a first encoder for generating a Reed-Solomon (RS) frame by adding RS parity data and cyclic redundancy check (CRC) data to enhanced data;
a second encoder for encoding the enhanced data in the RS frame with an encoding rate of 1/H, wherein $H \geq 2$;
a symbol interleaver for interleaving symbols corresponding to the encoded enhanced data, wherein the symbol interleaver interleaves the symbols using the following steps:
calculating L, wherein $L=2^m$, and wherein m is an integer,
listing all permuted positions P'(i) in ascending order of i according to the following equation:
P'(i)={89*i*(i+1)/2} mod L, wherein i is a natural number from 0 to L−1,
discarding all P'(i) that are P'(i)$\geq$B, wherein B is a block length of symbols being input to the symbol interleaver, and
condensing the list by, starting with a lowest i, shifting P(i) entries to the left to fill empty locations created by the discarding step;
a group formatter for mapping enhanced data corresponding to the interleaved symbols into a data group and adding known data sequences and signaling information into the data group;
a trellis encoder for trellis encoding the data group; and
a modulator for modulating a broadcast signal including the trellis-encoded data group.

2. The DTV transmitter of claim 1, wherein at least two of the known data sequences have different lengths.

3. The DTV transmitter of claim 1, wherein the signaling information includes information associated with the data group.

4. The DTV transmitter of claim 1, further comprising:
a converter for converting the interleaved symbols into interleaved bytes.

5. The DTV transmitter of claim 1, further comprising:
a multiplexer for multiplexing the enhanced data in the data group with main data.

6. A method of processing broadcast data in a digital television (DTV) transmitter, the method comprising:
generating, by a first encoder, a Reed-Solomon (RS) frame by adding RS parity data and cyclic redundancy check (CRC) data to enhanced data;
encoding, by a second encoder, the enhanced data in the RS frame with an encoding rate of 1/H, wherein $H \geq 2$;
interleaving symbols corresponding to the encoded enhanced data in a symbol interleaver, wherein the symbol interleaver interleaves the symbols using the following steps:
calculating L, wherein $L=2^m$, and wherein m is an integer,
listing all permuted positions P'(i) in ascending order of i according to the following equation:
P'(i)={89*i*(i+1)/2} mod L, wherein i is a natural number from 0 to L−1,
discarding all P'(i) that are P'(i)$\geq$B, wherein B is a block length of symbols being input to the symbol interleaver, and
condensing the list by, starting with a lowest i, shifting P(i) entries to the left to fill empty locations created by the discarding step;
mapping, by a group formatter, enhanced data corresponding to the interleaved symbols into a data group and adding known data sequences and signaling information into the data group;
trellis encoding, by a trellis encoder, the data group; and
modulating a broadcast signal including the trellis-encoded data group.

7. The method of claim 6, wherein at least two of the known data sequences have different lengths.

8. The method of claim 6, wherein the signaling information includes information associated with the data group.

9. The method of claim 6, further comprising:
converting the interleaved symbols into interleaved bytes.

10. The method of claim 6, further comprising:
multiplexing the enhanced data in the data group with main data.

* * * * *